(12) United States Patent
Natori

(10) Patent No.: US 9,595,551 B2
(45) Date of Patent: Mar. 14, 2017

(54) SOLID-STATE IMAGING DEVICE AND ELECTRONIC APPARATUS

(71) Applicant: SONY CORPORATION, Tokyo (JP)

(72) Inventor: Taichi Natori, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/908,989

(22) PCT Filed: Jul. 30, 2014

(86) PCT No.: PCT/JP2014/070040
§ 371 (c)(1),
(2) Date: Jan. 29, 2016

(87) PCT Pub. No.: WO2015/019913
PCT Pub. Date: Feb. 12, 2015

(65) Prior Publication Data
US 2016/0197108 A1    Jul. 7, 2016

(30) Foreign Application Priority Data

Aug. 7, 2013 (JP) ................................. 2013-164062

(51) Int. Cl.
*H01L 31/0232* (2014.01)
*H01L 27/146* (2006.01)

(52) U.S. Cl.
CPC ...... *H01L 27/1462* (2013.01); *H01L 27/1464* (2013.01); *H01L 27/14621* (2013.01);
(Continued)

(58) Field of Classification Search
CPC .......... H01L 27/1462; H01L 27/14645; H01L 27/14623; H01L 27/14621; H01L 27/14625; H01L 27/1464; H01L 27/14685
See application file for complete search history.

(56) References Cited

U.S. PATENT DOCUMENTS

2011/0285881 A1*  11/2011  Izuha .................. H04N 5/2254
                                                  348/279
2013/0134537 A1*  5/2013  Nakajiki .......... H01L 27/14627
                                                  257/432
(Continued)

FOREIGN PATENT DOCUMENTS

JP      2005-294647     10/2005
JP      2006-317776     11/2006
(Continued)

*Primary Examiner* — Victor A Mandala
(74) *Attorney, Agent, or Firm* — Chip Law Group

(57) ABSTRACT

There is provided a solid-state imaging device that includes: colored pixels each including a first photoelectric conversion element and a colored filter; white pixels each including a second photoelectric conversion element and a clear layer; and an interlayer insulating film provided between the first photoelectric conversion element and the colored filter, and between the second photoelectric conversion element and the clear layer. The colored filter is provided on light-entering side of the first photoelectric conversion element. The clear layer is provided on light-entering side of the second photoelectric conversion element. The clear layer has a higher refractive index than a refractive index of the colored filter, and includes an inorganic dielectric film made of a different material from a material of the interlayer insulating film.

9 Claims, 28 Drawing Sheets

(52) U.S. Cl.
CPC .. *H01L 27/14623* (2013.01); *H01L 27/14625* (2013.01); *H01L 27/14645* (2013.01); *H01L 27/14685* (2013.01)

(56) References Cited

U.S. PATENT DOCUMENTS

| | | | | |
|---|---|---|---|---|
| 2013/0334402 | A1* | 12/2013 | Izuha | H01L 27/146 250/208.1 |
| 2014/0002700 | A1* | 1/2014 | Oishi | H04N 5/369 348/273 |
| 2015/0109495 | A1* | 4/2015 | Tanaka | H01L 27/14621 348/277 |
| 2015/0109498 | A1* | 4/2015 | Aoki | H04N 5/345 348/280 |
| 2016/0086990 | A1* | 3/2016 | Liu | H01L 27/14621 257/432 |

FOREIGN PATENT DOCUMENTS

| | | |
|---|---|---|
| JP | 2007-199386 | 8/2007 |
| JP | 2008-172580 | 7/2008 |
| JP | 2009-080313 | 4/2009 |
| JP | 2012-074521 | 4/2012 |
| JP | 2012-074763 | 4/2012 |

* cited by examiner

SOLID-STATE IMAGING DEVICE AND ELECTRONIC APPARATUS

TECHNICAL FIELD

The disclosure relates to a solid-state imaging device including white pixels, and an electronic apparatus including the solid-state imaging device.

BACKGROUND ART

CMOS (Complementary Metal-Oxide Semiconductor) image sensors may exemplify solid-state imaging devices installed in digital video cameras, digital still cameras, tablet computers, smartphones, mobile phones, etc. In CMOS image sensors, photoelectric charges are accumulated in pn junction capacitance of photodiodes (PDs) that serve as photoelectric conversion elements; the photoelectric charges thus accumulated are read out through MOS transistors.

In solid-state imaging devices, micro-miniaturization of pixel sizes is being promoted in accordance with an increase in the number of pixels. Micro-miniaturization is accompanied by a shrink of PD area and a decrease in an amount of entering light, causing lower sensitivity. To compensate the lower sensitivity, white pixels have come into use instead of color filters. The white pixels include clear layers that have little absorption in visible light region. Various proposals have been made concerning materials and methods of fabrication of the clear layers. For example, Patent Literature 1 provides description that the clear layers are made of the same material as that of an interlayer insulating film as an interlayer, e.g., a $SiO_2$ film.

CITATION LIST

Patent Literature

Patent Literature 1: JP2012-74763A

SUMMARY OF INVENTION

In solid-state imaging devices including white pixels, color mixture of the white pixels with adjacent colored pixels may occur easily. To restrain color mixture has been therefore desired. Moreover, when the clear layers are made of the same material as that of the interlayer insulating film as the underlayer, etching treatment of the clear layer becomes difficult, causing lower shape precision.

It is therefore desirable to provide a solid-state imaging, device that makes it possible to restrain color mixture and to improve shape precision, and an electronic apparatus including the solid-state imaging device.

A solid-state imaging device according to an embodiment of the disclosure includes: colored pixels each including a first photoelectric conversion element and a colored filter; white pixels each including a second photoelectric conversion element and a clear layer; and an interlayer insulating film provided between the first photoelectric conversion element and the colored filter, and between the second photoelectric conversion element and the clear layer. The colored filter is provided on light-entering side of the first photoelectric conversion element. The clear layer is provided on light-entering side of the second photoelectric conversion element. The clear layer has a higher refractive index than a refractive index of the colored filter, and includes an inorganic dielectric film made of a different material from a material of the interlayer insulating film.

In the solid-state imaging device according to the embodiment of the disclosure, the refractive index of the clear layer is higher than the refractive index of the colored filter. Thus, light obliquely entering the clear layer is reflected at an interface between the clear layer and the colored filter, and the reflected light is returned toward the clear layer. This leads to a decrease in an amount of light that passes through the clear layer to enter adjacent pixels, restraining color mixture of the white pixels with adjacent colored pixels. Moreover, the clear layer includes the inorganic dielectric film made of the different material from the material of the interlayer insulating film. This makes it possible to control an etching amount of the clear layer with high precision, leading to improvement in shape precision.

An electronic apparatus according to an embodiment of the disclosure is provided with a solid-state imaging device. The solid-state imaging device includes: colored pixels each including a first photoelectric conversion element and a colored filter; white pixels each including a second photoelectric conversion element and a clear layer; and an interlayer insulating film provided between the first photoelectric conversion element and the colored filter, and between the second photoelectric conversion element and the clear layer. The colored filter is provided on light-entering side of the first photoelectric conversion element. The clear layer is provided on light-entering side of the second photoelectric conversion element. The clear layer has a higher refractive index than a refractive index of the colored filter, and includes an inorganic dielectric film made of a different material from a material of the interlayer insulating film.

In the electronic apparatus according to the above-described embodiment of the disclosure, imaging is performed by the solid-state imaging device.

According to the solid-state imaging device according to the embodiment of the disclosure, or the electronic apparatus according to the embodiment of the disclosure, the refractive index of the clear layer is higher than the refractive index of the colored filter. Hence, it is possible to reduce the amount of light passing through the clear layer and entering adjacent pixels, and to restrain color mixture of the white pixels with the adjacent colored pixels. Moreover, the clear layer includes the inorganic dielectric film made of the different material from the material of the interlayer insulating film. Hence, it is possible to control the etching amount of the clear layer with high precision, leading to improvement in shape precision.

Note that effects of the disclosure are not limited to those described here, but may be any of effects described in the followings.

Figure 7:
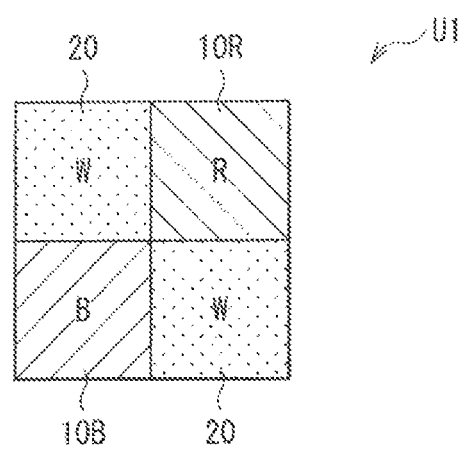
FIG. 7 is a plan view of one example of a two-row, two-column unit array in the solid-state imaging device illustrated in FIG. 1.

FIG., 9 is a plan view of a configuration in which the unit array illustrated in FIG. 7 is arranged in a plurality.

Figure 1:
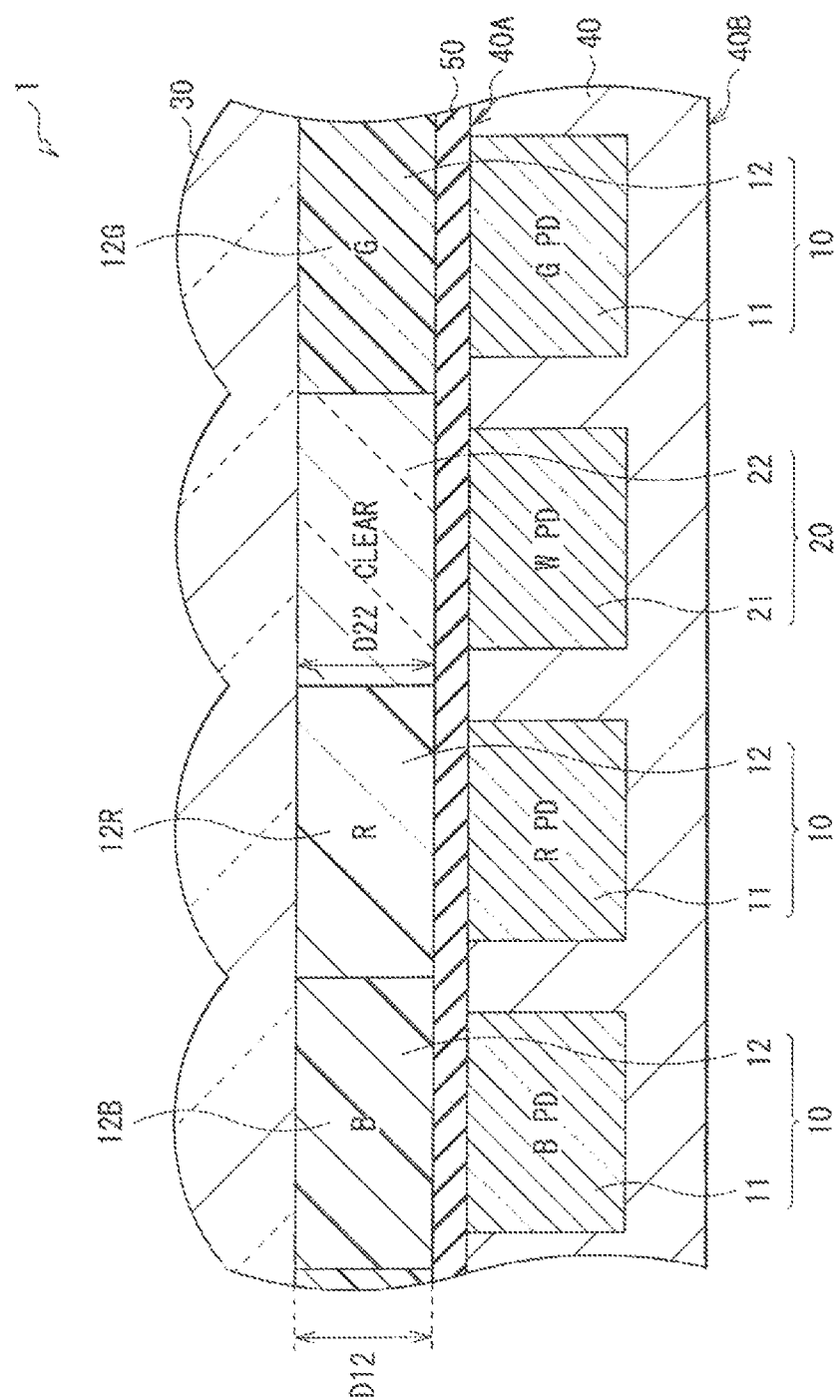
FIG. 1 is a cross-sectional view of a configuration of a solid-state imaging device according to a first embodiment of the disclosure.
Figure 10:
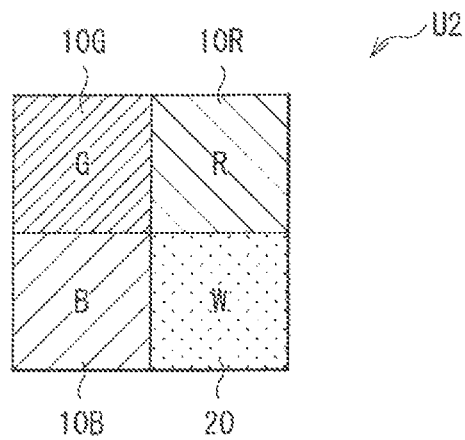

FIG. 10 is a plan view of another example of the two-row, two-column unit array in the solid-state imaging device illustrated in FIG. 1.

Figure 11:
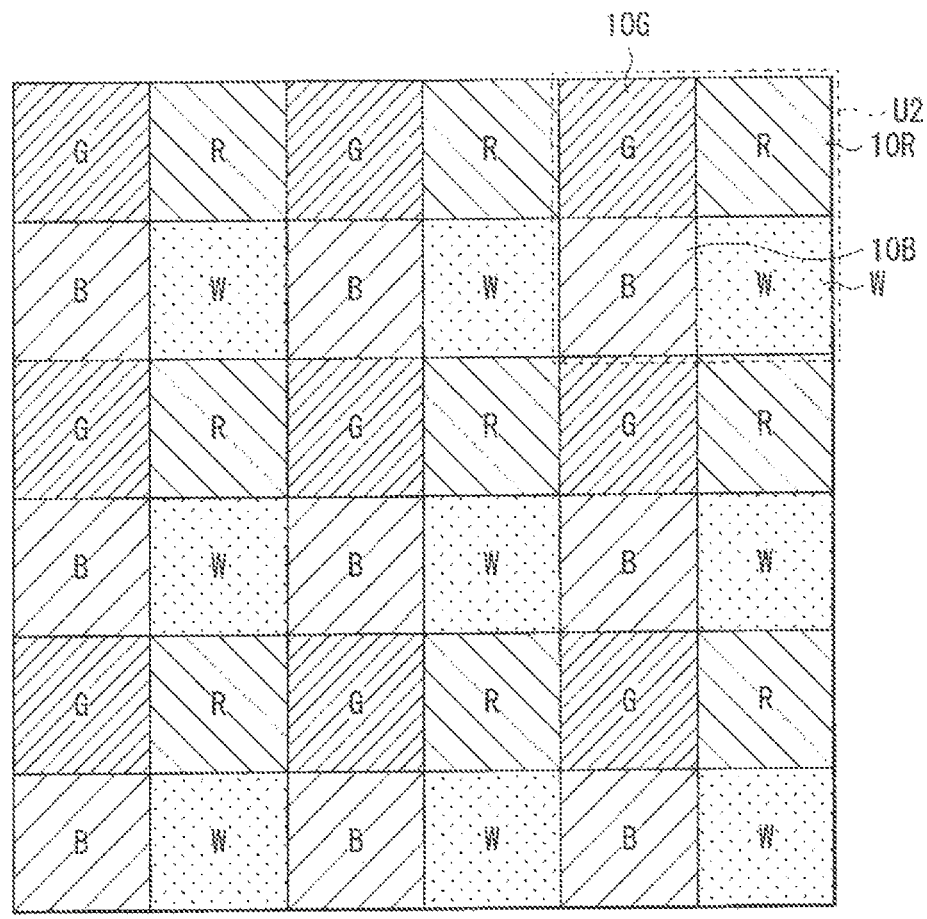

FIG. 11 is a plan view of a configuration in which the unit array illustrated in FIG. 10 is arranged in a plurality.

Figure 12:
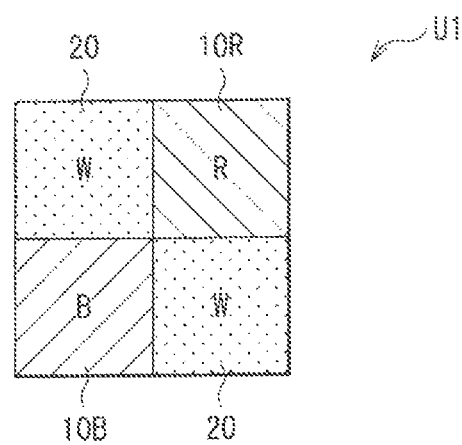

FIG. 12 is a plan view of a unit array to which a method of manufacturing the solid-state imaging device according to the embodiment is applied.

Figure 13:
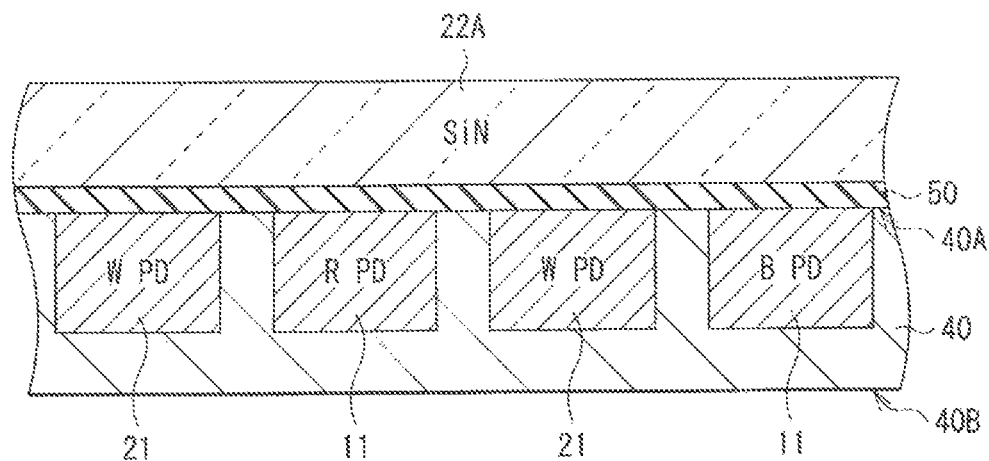

FIG. 13 is a cross-sectional view of the method of manufacturing the solid-state imaging device having the unit array illustrated m FIG. 12, in the order of procedure.

Figure 14:
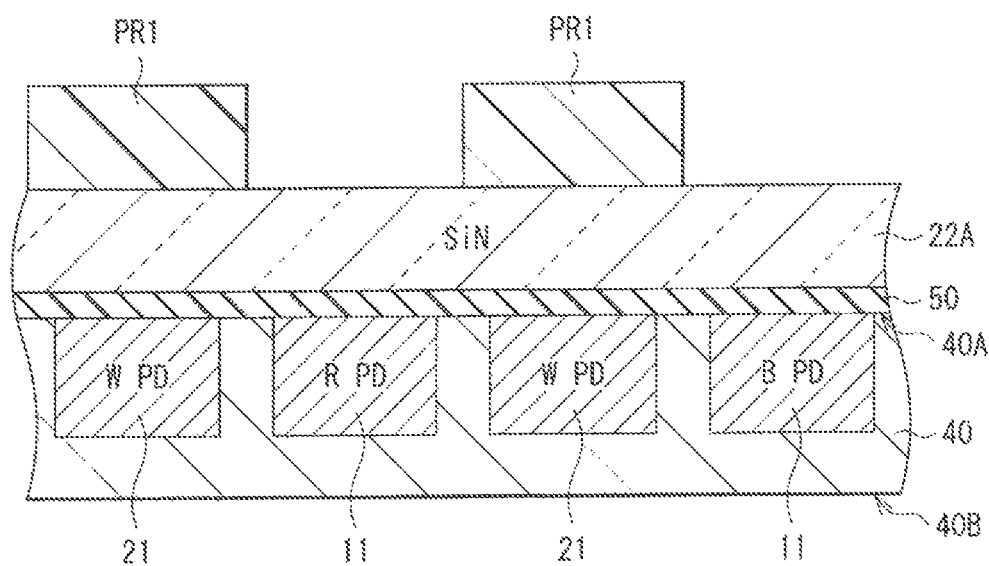

FIG. 14 is a cross-sectional view of a process following FIG. 13.

Figure 15:
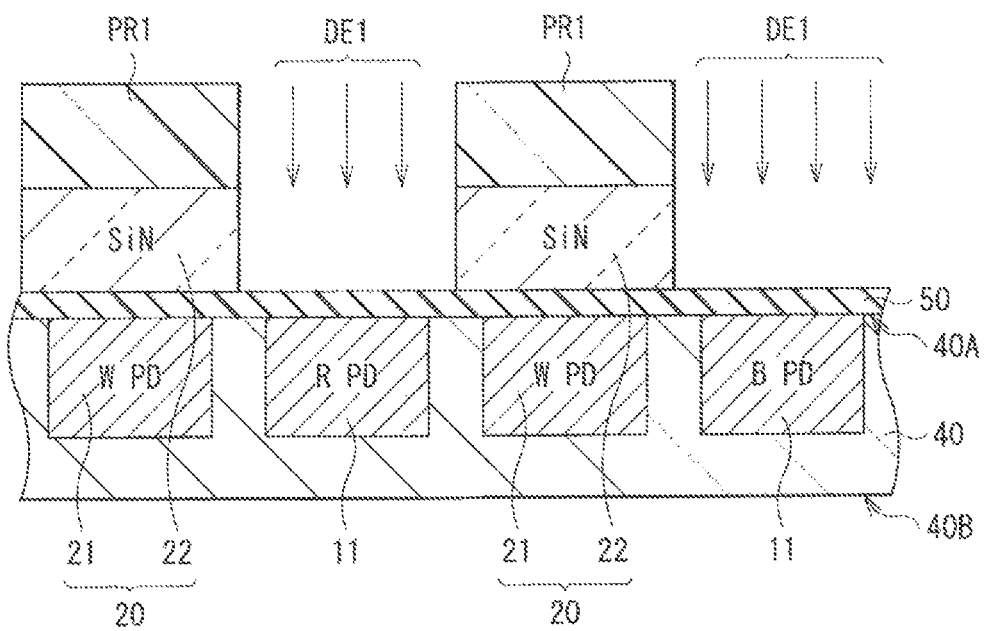

FIG. 15 is a cross-sectional view of a process following FIG. 14.

Figure 16:
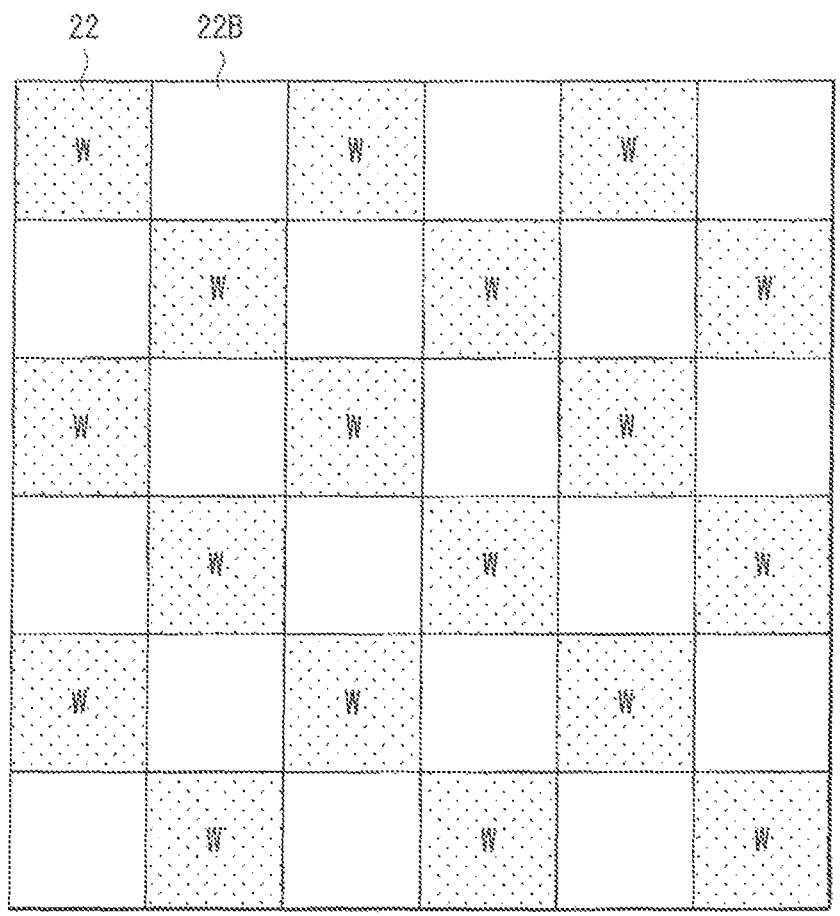

FIG. 16 is a plan view of an arrangement of the clear layer illustrated in FIG. 15.

Figure 17:
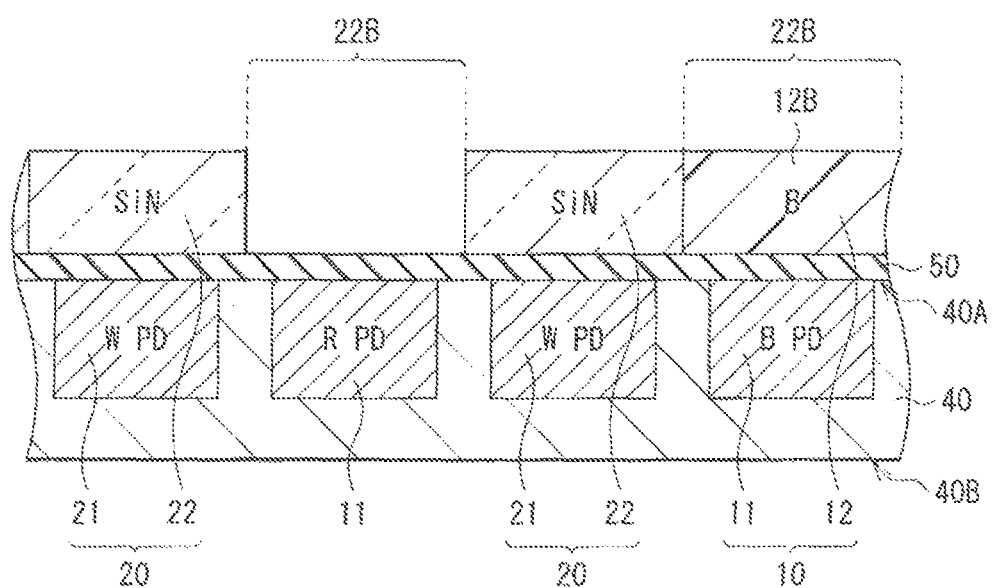

FIG. 17 is a cross-sectional view of a process following FIG. 15.

Figure 18:
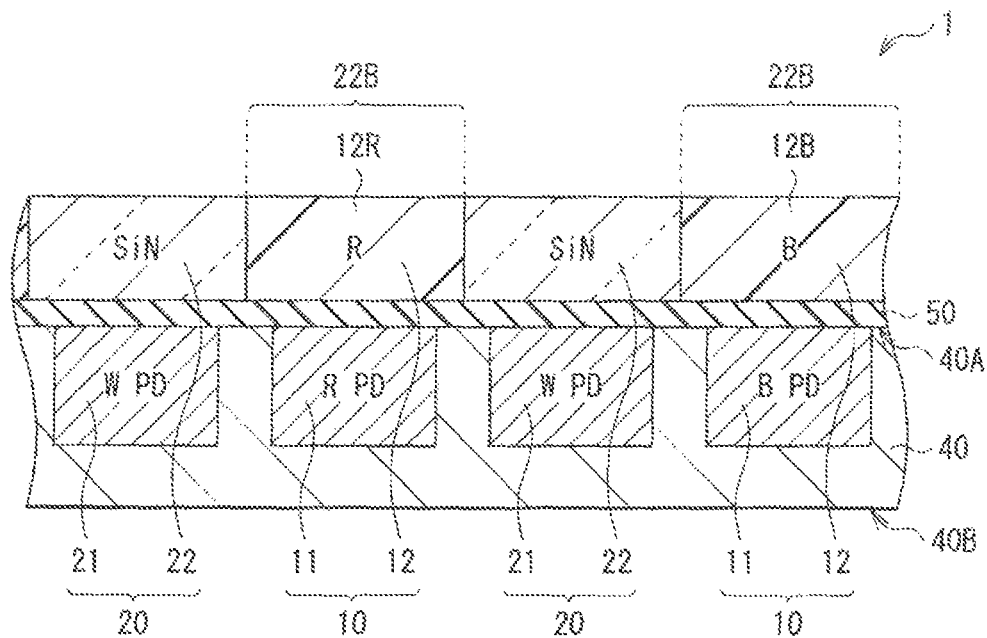

FIG. 18 is a cross-sectional view of u process following FIG. 17.

Figure 19:
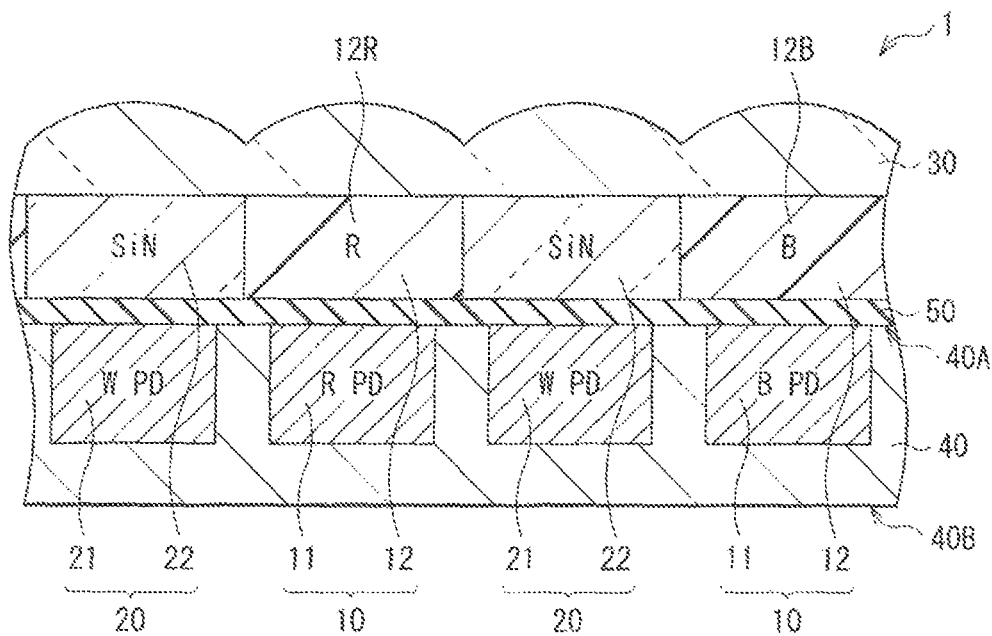

FIG. 19 is a cross-sectional view of a process following FIG. 18.

Figure 20:
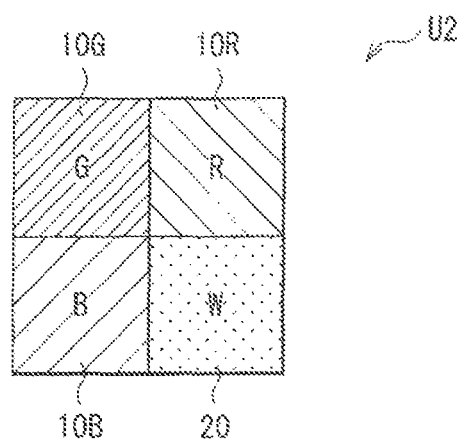

FIG. 20 is a plan view of a unit array to which a method of manufacturing a solid-state imaging device according to a second embodiment of the disclosure is applied.

Figure 21:
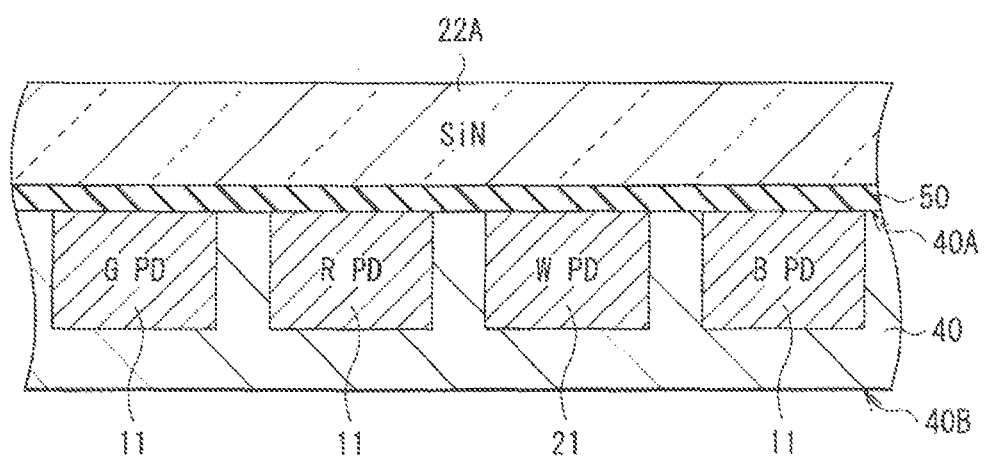

FIG. 21 is a cross-sectional view of the method of manufacturing the solid-state imaging device having the unit array illustrated in FIG. 20, in the order of procedure.

Figure 22:
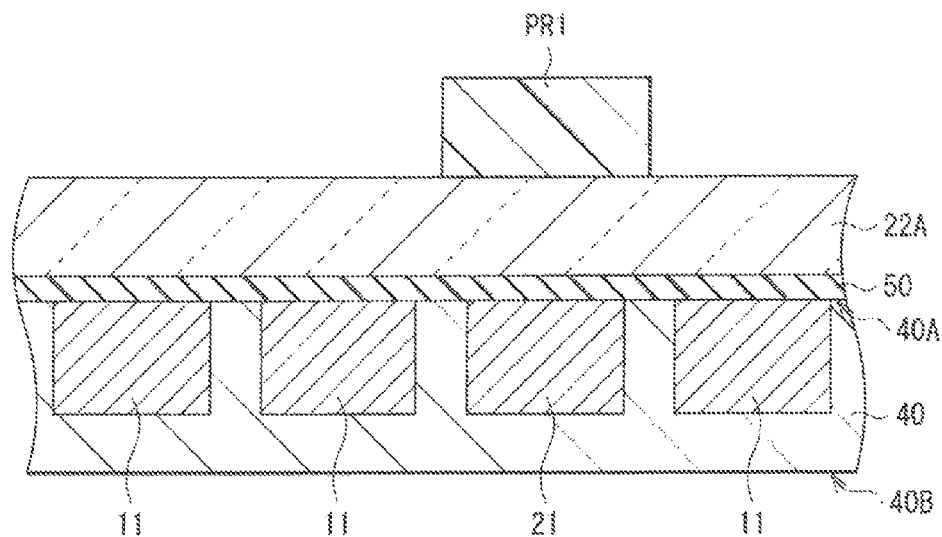

FIG. 22 is a cross-sectional view of a process following FIG. 21.

Figure 23:
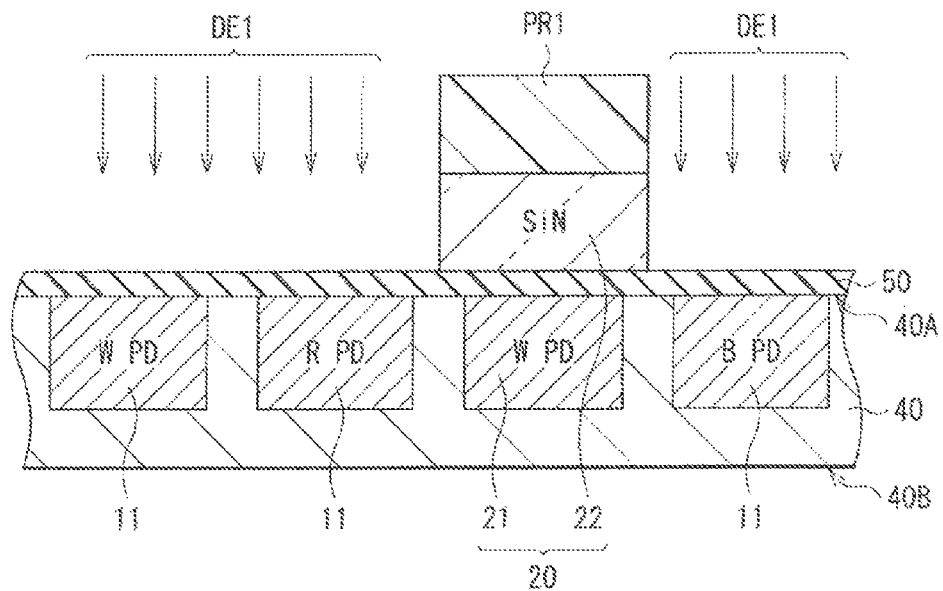

FIG. 23 is a cross-sectional view of a process following FIG. 22.

Figure 24:
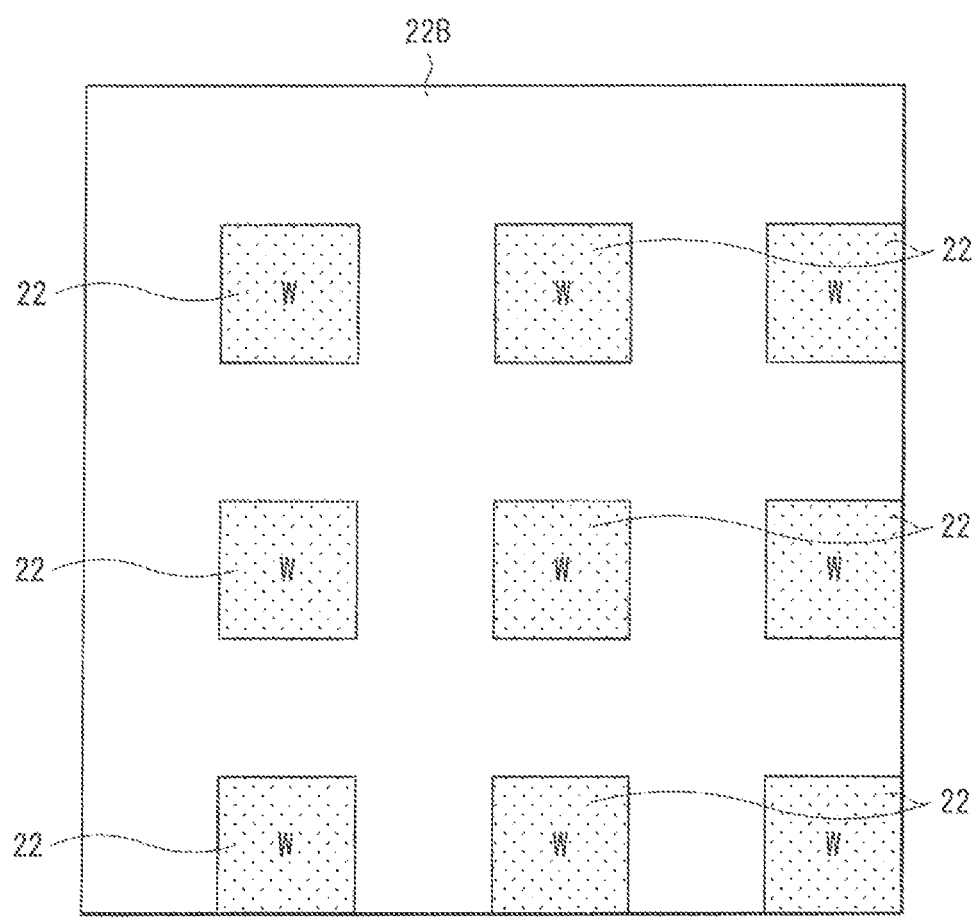

FIG. 24 is a plan view of an arrangement of the clear layer illustrated in FIG. 23.

Figure 25:
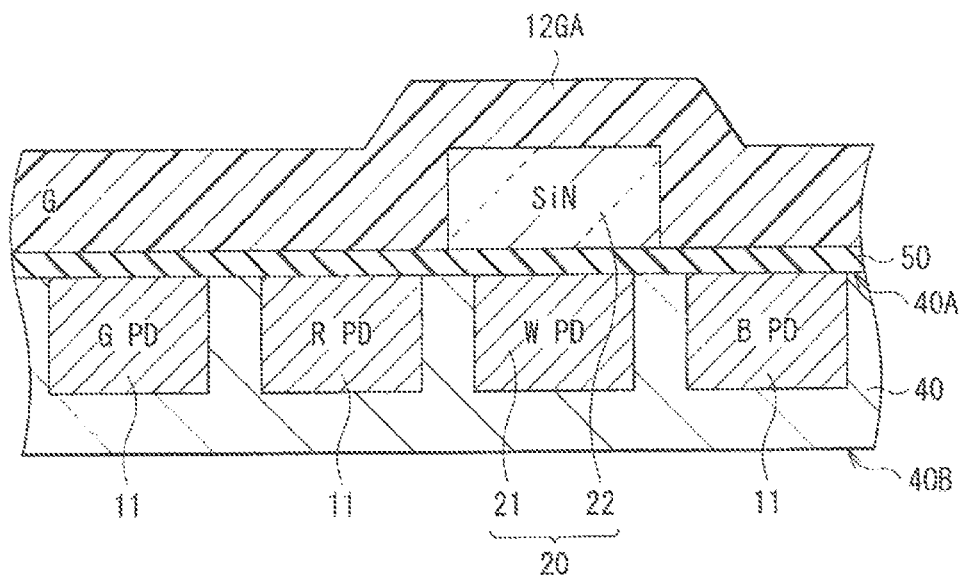

FIG. 25 is a cross-sectional view of a process following FIG. 23.

Figure 26:
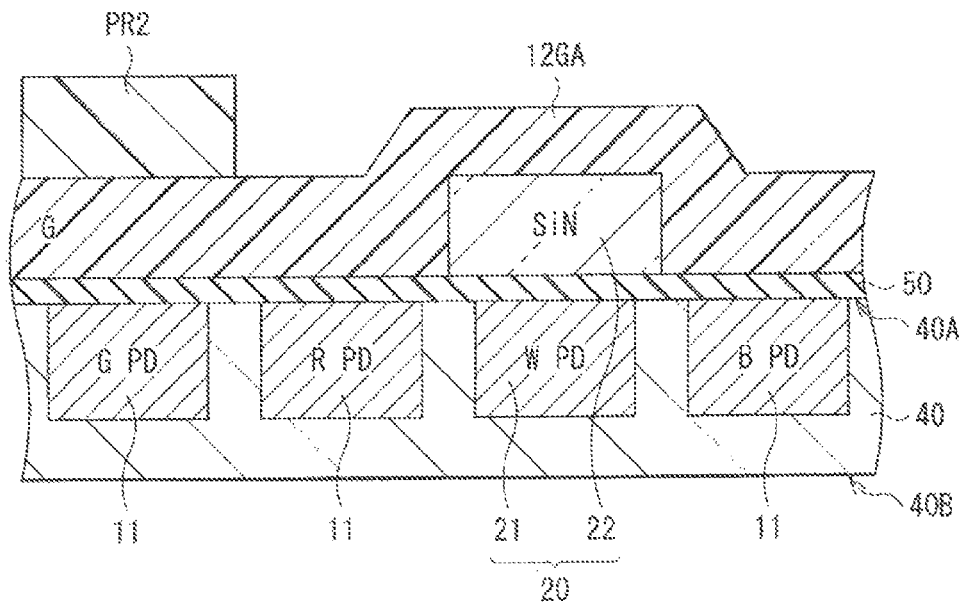

FIG. 26 is a cross-sectional view of a process following FIG. 25.

Figure 27:
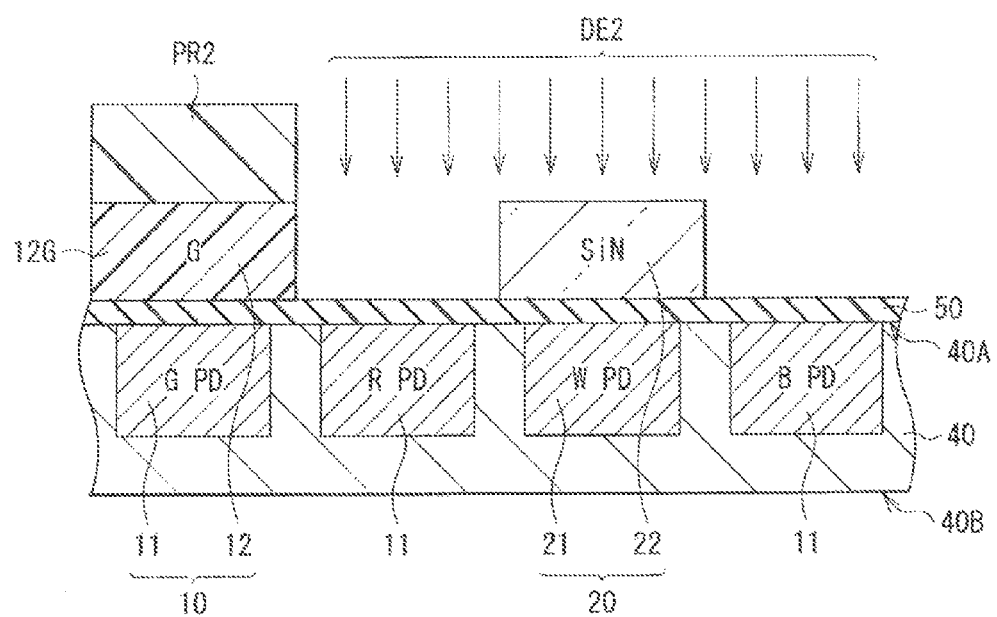

FIG. 27 is a cross-sectional view of a process following FIG. 26.

Figure 28:
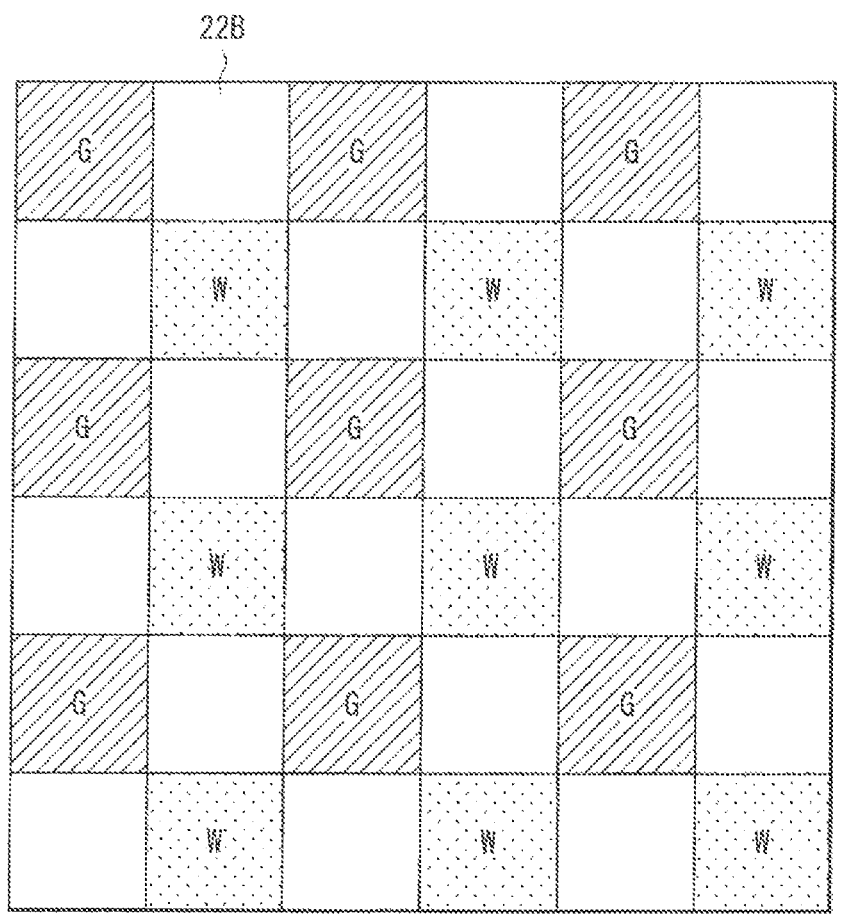

FIG. 28 is a plan view of an arrangement of the clear layer and a green filter illustrated in FIG. 27.

Figure 29:
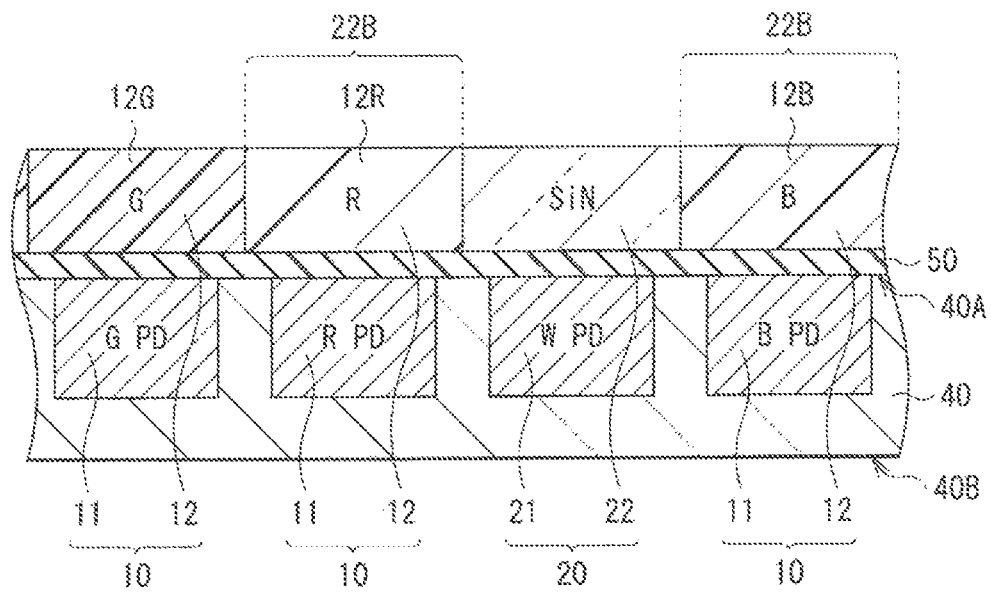

FIG. 29 is a cross-sectional view of a process following FIG. 27.

Figure 30:
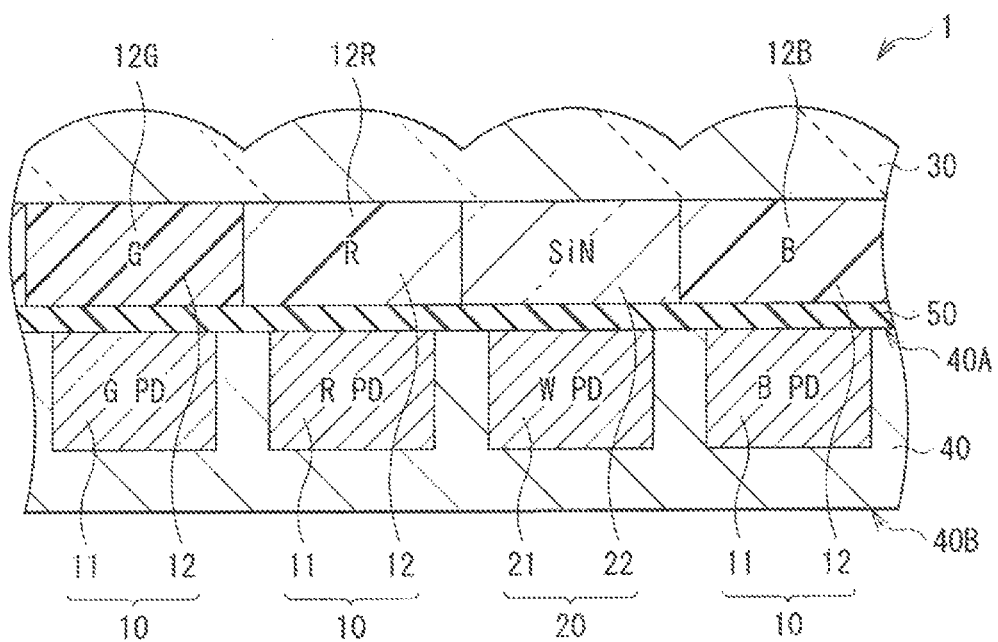

FIG. 30 is a cross-sectional view of a process following FIG. 29.

Figure 31:
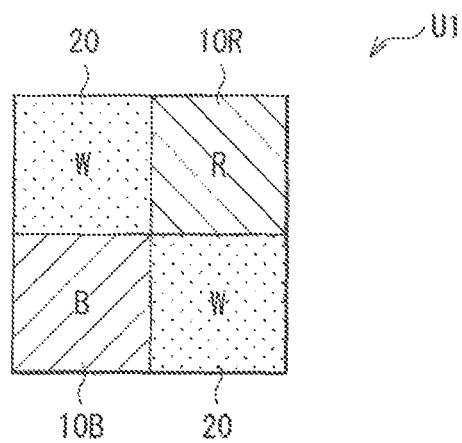

FIG. 31 is a plan view of a unit array to which a method of manufacturing a solid-slate imaging device according to a third embodiment of the disclosure is applied.

Figure 32:
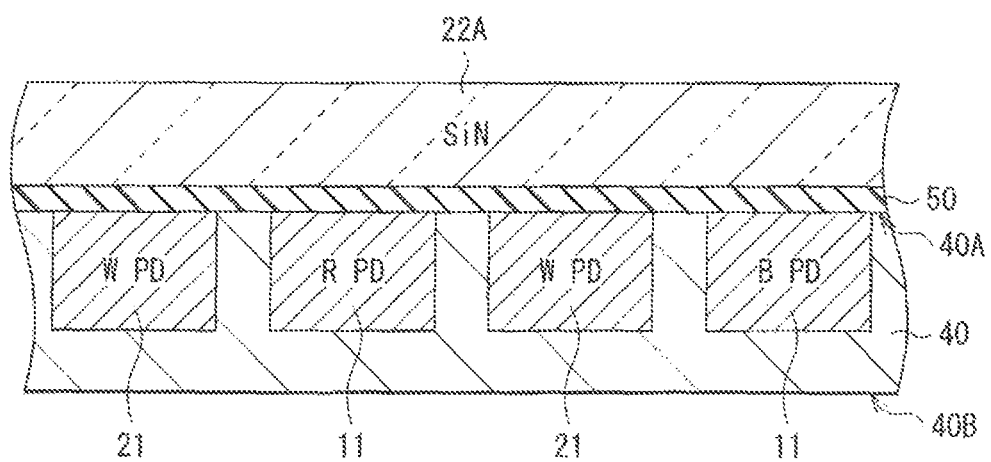

FIG. 32 is a crass-sectional view of the method of manufacturing the solid-state imaging device having the unit array illustrated in FIG. 31, in the order of procedure.

Figure 33:
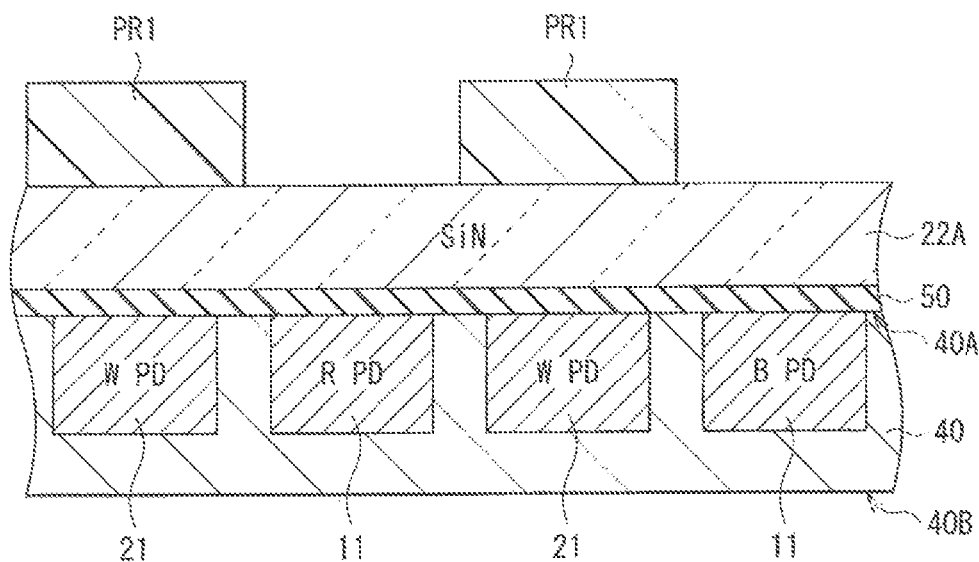

FIG. 33 is a cross-sectional view of a process following FIG. 32.

Figure 34:
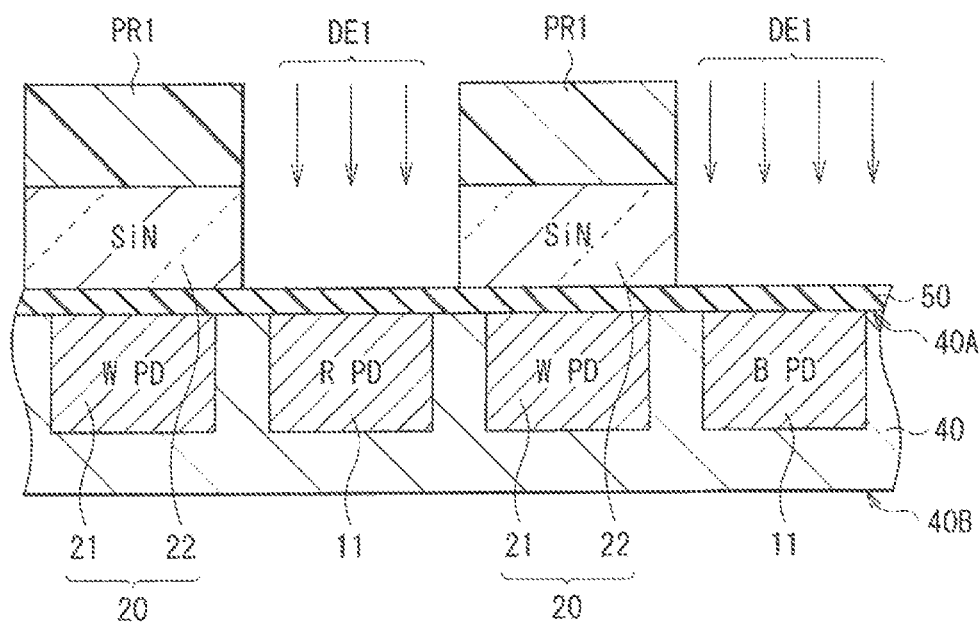

FIG. 34 is a cross-sectional view of a process following FIG. 33.

Figure 35:
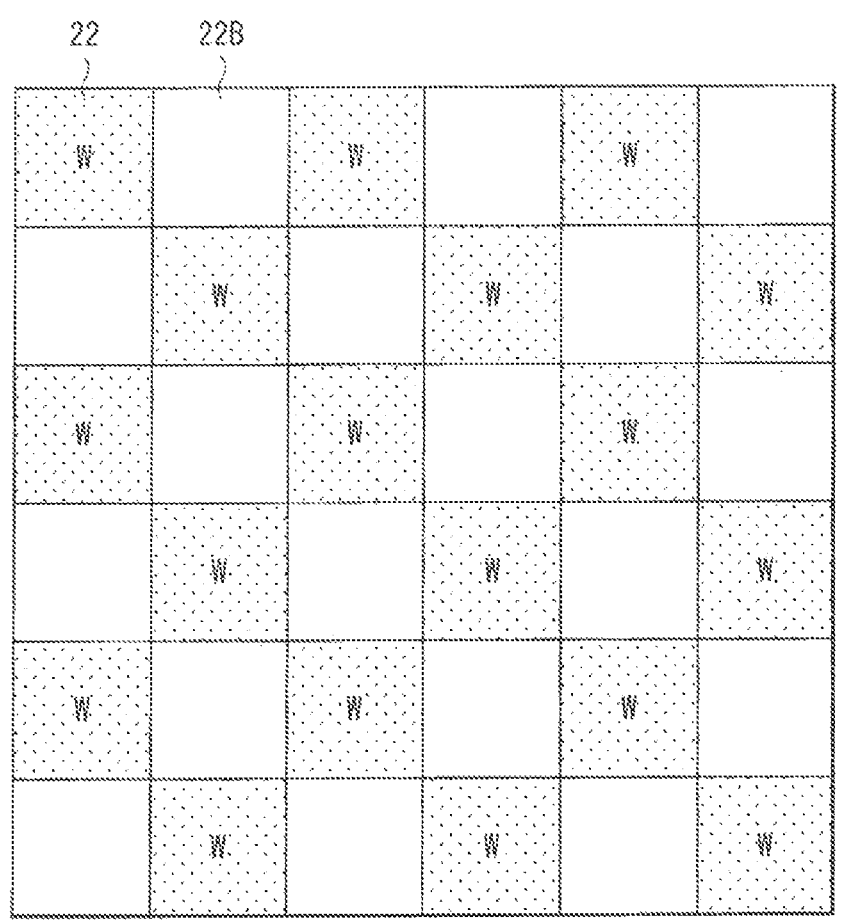

FIG. 35 is a plan view of an arrangement of the clear layer illustrated in FIG. 34.

Figure 36:
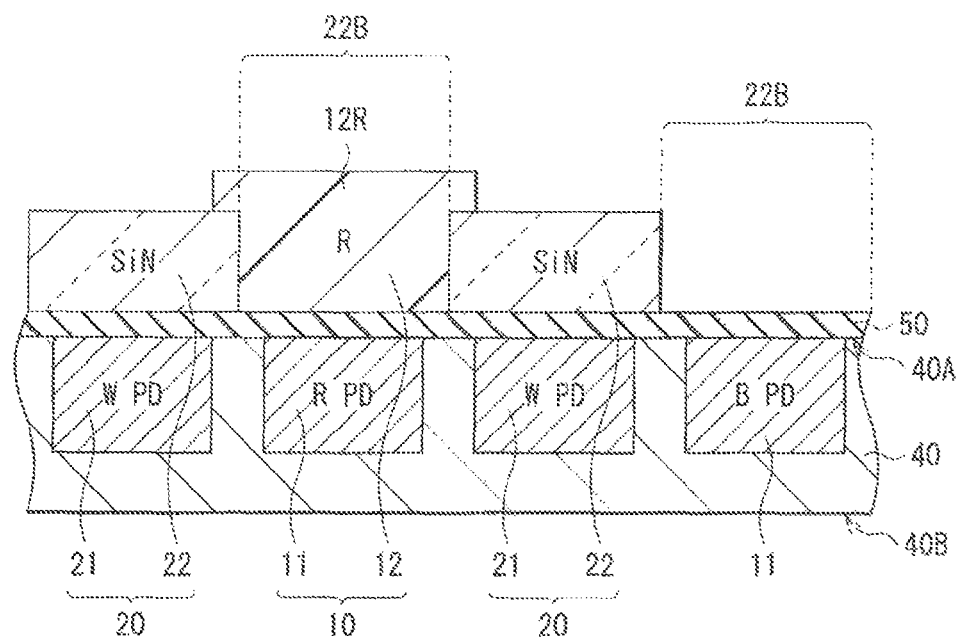

FIG. 36 is a cross-sectional view of a process following FIG. 34.

Figure 37:
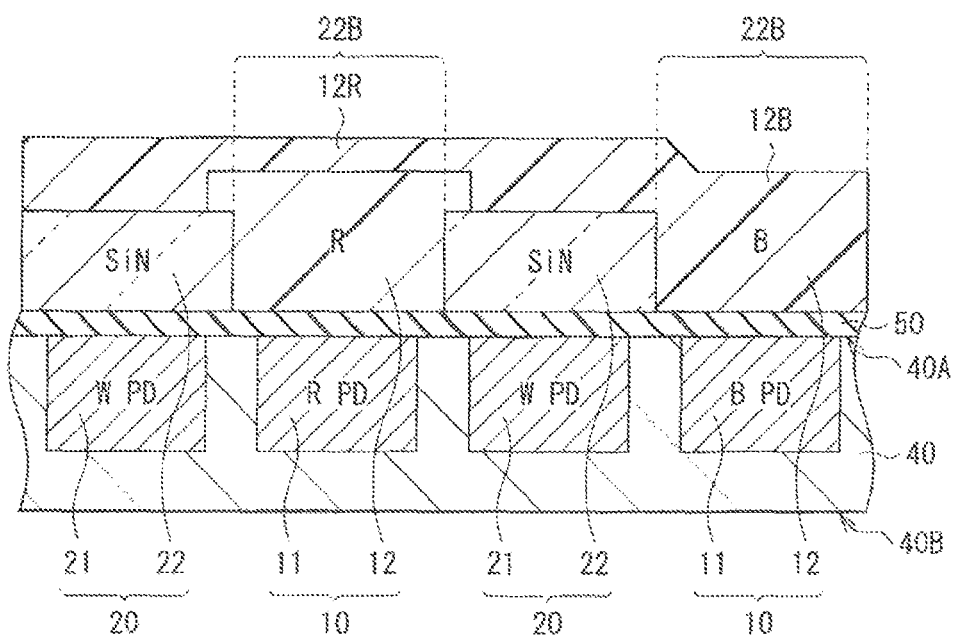

FIG. 37 is a cross-sectional view of a process following FIG. 36.

Figure 38:
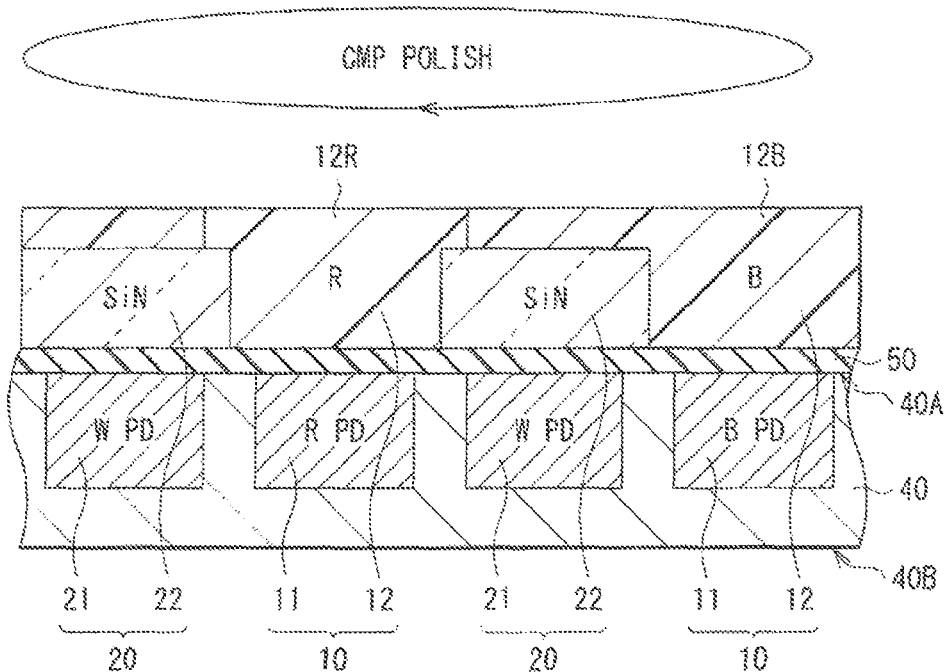

FIG. 38 is a cross-sectional view of a process following FIG. 37.

Figure 39:
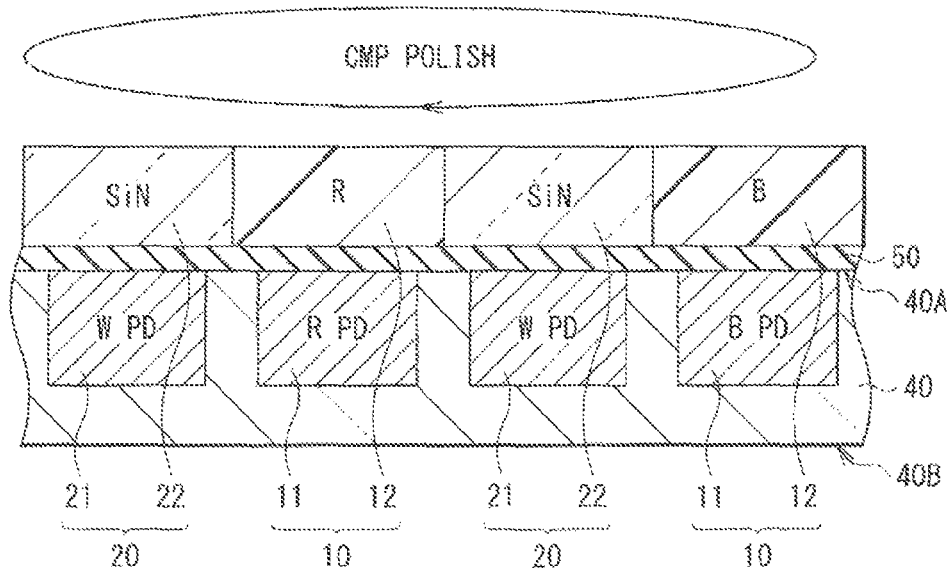

FIG. 39 is a cross-sectional view of a process following FIG. 38.

Figure 40:
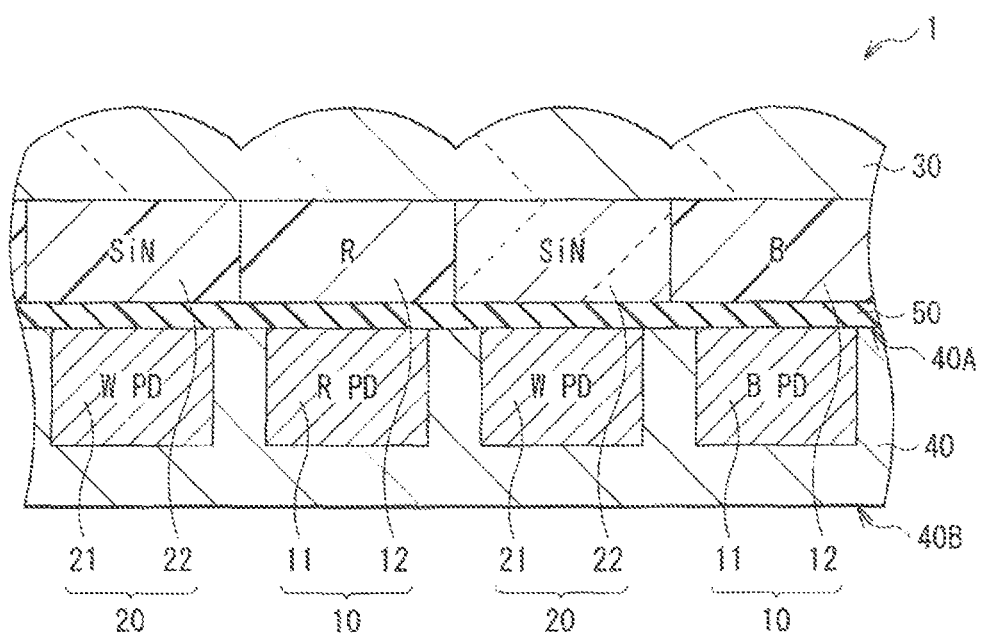

FIG. 40 is a cross-sectional view of a process following FIG. 39.

Figure 41:
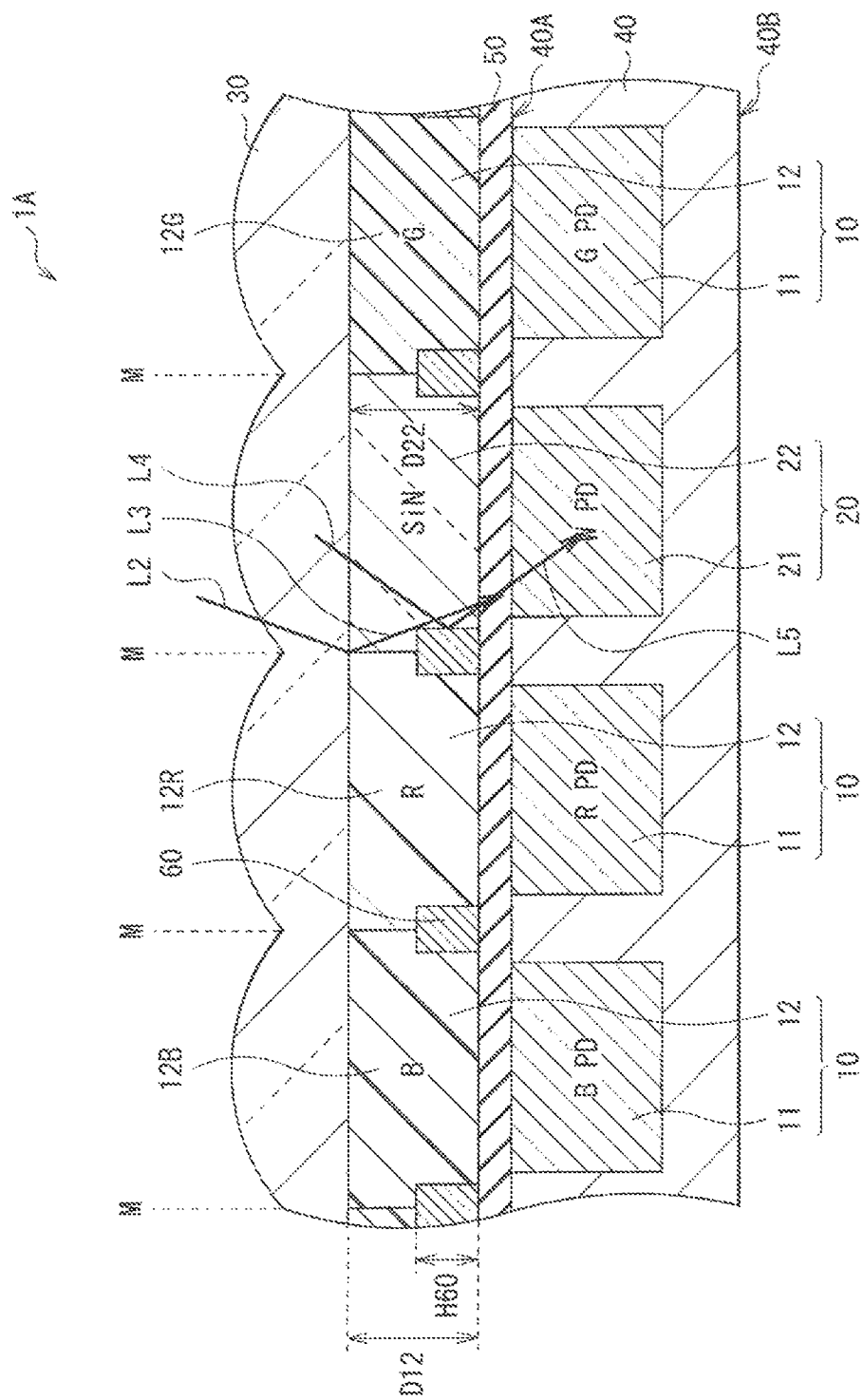

FIG. 41 is a cross-sectional view of a configuration of a solid-state imaging device according to a fourth embodiment of the disclosure.

Figure 42:
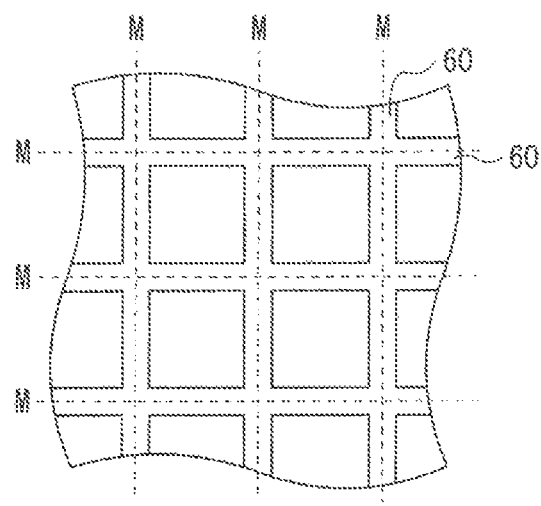

FIG. 42 is a plan view of a configuration of a light-shielding wall illustrated in FIG. 41.

Figure 43:
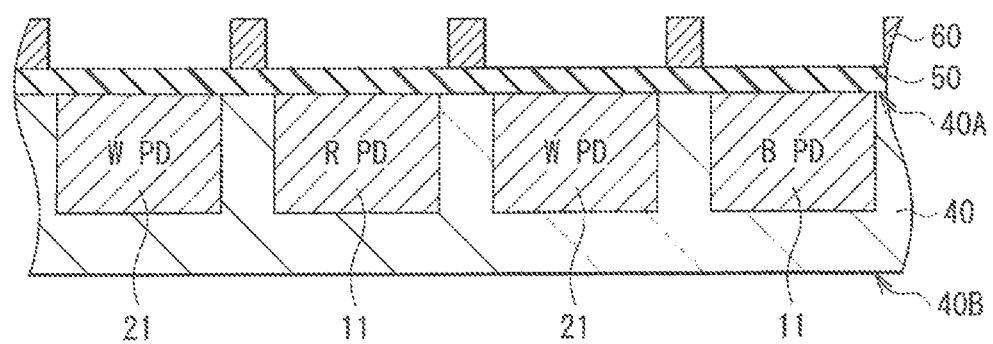

FIG. 43 is a cross-sectional view of a process in a method of manufacturing the solid-state imaging device illustrated in FIG. 41.

Figure 44:
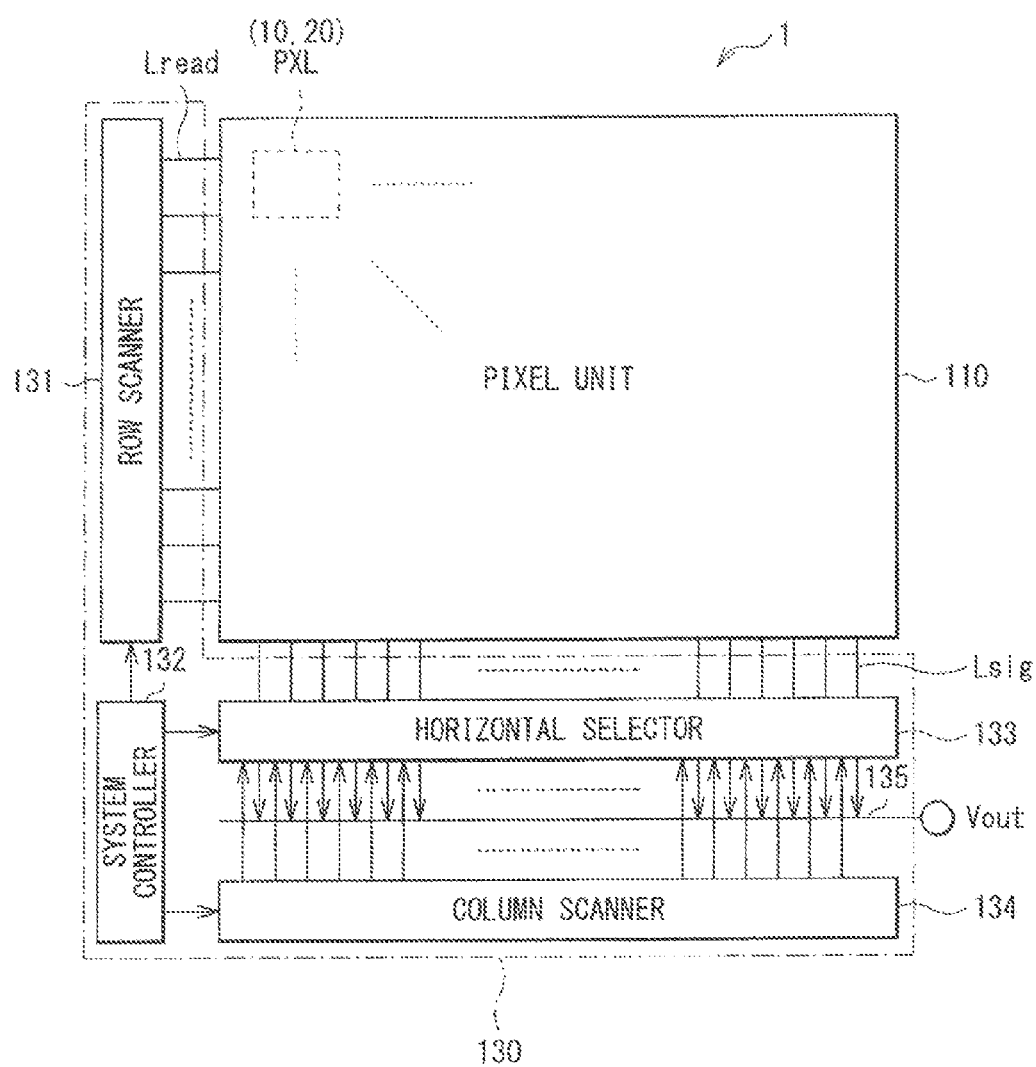
Figure 46:
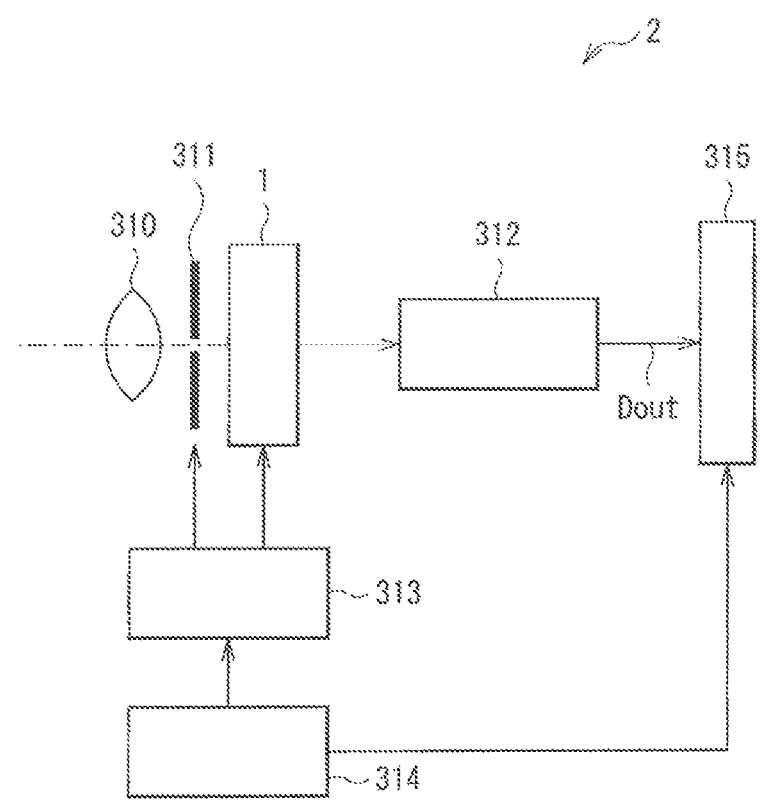

FIG. 44 is a functional block diagram of a solid-state imaging device.

FIG. 45 is a functional block diagram of an electronic apparatus according to an application example.

DESCRIPTION OF EMBODIMENTS

In the following, some embodiments of the disclosure are described in detail with reference to the drawings. Note that description is made in the following order.

1.First Embodiment (an example with W pixels arranged in a checkered pattern and RB colored pixels)

2.Second Embodiment (a method of manufacture: an example with W pixels and RGB colored pixels)

3.Third Embodiment (a method of manufacture: an example of a method of manufacture using CMP)

4.Fourth Embodiment (an example with a light-shielding wall)

5. Example of Overall Configuration of Solid-State imaging Device

6. Application Example (an example of an electronic apparatus)

First Embodiment

FIG. 1 illustrates a cross-sectional configuration of a solid-state imaging device according to a first embodiment of the disclosure. The solid-state imaging device 1 may be a CMOS image sensor used in electronic apparatuses such as digital still cameras and video cameras, and may include an imaging pixel region (a later-described pixel unit 110) in which a plurality of colored pixels 10 and a plurality of white pixels 20 are two-dimensionally arranged. The solid-state imaging device 1 may be either of a backside illuminated type or of a front illuminated type; here, for purpose of example, description is given of a structure of the backside illuminated type.

The colored pixels 10 each include, for example, a first photoelectric conversion element 11 and a colored filter 12. The colored pixels 10 each are adapted to detect a wavelength of either one of for example, red (R), green (G), and blue (B). The first photoelectric conversion element 11 may include a photodiode. The colored filter 12 is provided on light-entering side of the first photoelectric conversion element 11. Note that red (R), green (G), and blue (B) are colors respectively corresponding to a wavelength range of, for example, 600 nm to 750nm both inclusive, a wavelength range of, for example, 495 nm to 570 nm both inclusive, and a wavelength range of, for example, 450 nm to 495 nm both inclusive.

The white pixels 20 each include, for example, a second photoelectric conversion element 21 and a clear layer (or a clear filter) 22. The white pixels 20 each are adapted to detect entering light without color separation of the entering light. The second photoelectric conversion element 21 may include a photodiode. The clear layer 22 is provided on light-entering side of the second photoelectric conversion element 21. In other words, the white pixels 20 each include, instead of the colored filter 12, the clear layer 22 that has little absorption in visible light region (e.g., 400 nm to 800 nm both inclusive). This allows the second photoelectric conversion element 21 to perform photoelectric conversion of light of a wavelength range that is normally abandoned by the colored filter 12. Hence, in the white pixels 20, it is possible to compensate lower sensitivity accompanying micro-miniaturization, attaining high sensitivity.

An on-chip lens 30 may be disposed on light-entering side of the colored filter 12 and the clear layer 22. The on-chip lens 30 is adapted to concentrate light entering the on-chip lens 30 from above, toward light receiving surfaces of the first photoelectric conversion element 11 and the second photoelectric conversion element 21.

The first photoelectric conversion element 11 and the second photoelectric conversion element 21 (i.e., photodiodes) each may be formed with a thickness of for example, approximately several μm, on the side of a rear surface 40A of a substrate 40 made of silicon (Si). The first photoelectric conversion element 11 and the second photoelectric conversion element 21 may have similar configurations, though denoted by different reference numerals for purpose of convenience.

An interlayer insulating film 50 is provided between the first photoelectric conversion dement 11 (or the rear surface 40A of the substrate 40) and the colored filter 12, and between the second photoelectric conversion element 21 (or the rear surface 40A of the substrate 40) and the clear layer 22. The interlayer insulating film 50 may have a function of a protective film that protects the light receiving surfaces of the first photoelectric conversion element 11 and the second photoelectric conversion element 21. The interlayer insulating film 50 may be made of for example, a silicon oxide film (a $SiO_2$ film), a silicon nitride oxide film (SiON) or a silicon carbide film (SiC).

Though not illustrated, a transfer transistor, a floating diffusion (FD), multi-layered wirings, and other components may be provided on the side of a front surface 40B of the substrate 40. The transfer transistor is a switching element adapted to transfer, to the FD, charges accumulated in the first photoelectric conversion element 11. The FD may be coupled to a signal processing unit (not illustrated) through the multi-layered wirings. The multi-layered wirings are adapted to perform drive of the first photoelectric conversion element 11 and the second photoelectric conversion element 21, signal transfer, voltage application to each section, and other actions. Note that a support substrate (not illustrated) may be bonded on the side of the front surface 40B of the substrate 40.

The colored filter 12 may include, for example, a red filter 12R, a green filter 12G and a blue filter 12B. The red filter 12R is adapted to obtain, from the first photoelectric conversion element 11, a signal corresponding to a wavelength range of red. The green filter 12G is adapted to obtain, from the first photoelectric conversion element 11, a signal corresponding to a wavelength range of green. The blue filter 12B is adapted to obtain, from the first photoelectric conversion element 11, a signal corresponding to a wavelength range of blue. The colored filter 12 may be made of, for example, a resin mixed with a pigment. Selection of the pigment allows for adjustment to increase light transmittance in a target wavelength range of red, green, or blue, and to lower light transmittance in other wavelength ranges.

The clear layer 22 has a higher refractive index than a refractive index of the colored filter 12, and includes an inorganic dielectric film made of a different material from a material of the interlayer insulating film 50. Hence, in the solid-state imaging device 1, it is possible to restrain color mixture and to improve shape precision.

A thickness D22 of the clear layer 22 may be preferably equal to or larger than a thickness D12 of the colored filter 12. One reason may be as follows; when the thickness D22 of the clear layer 22 is smaller than the thickness D12 of the colored filter 12, there is possibility that light that ought to enter the clear layer 22 may enter the colored filter 12.

In the following, description is given on each of the above-mentioned three features of the clear layer 22; (A) being made of the inorganic dielectric film; (B) having the higher refractive index than the refractive index of the colored filter 12; and (C) being made of the different material from the material of the interlayer insulating film 50.

(A) Being Made of the Inorganic Dielectric Film

Figure 2:
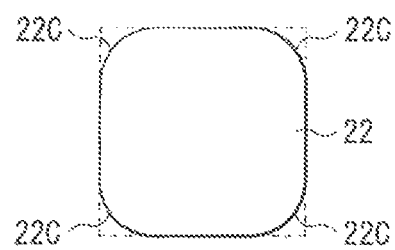
FIG. 2 is a plan view of one example of a shape of a clear layer made of a clear resin.
Figure 3:
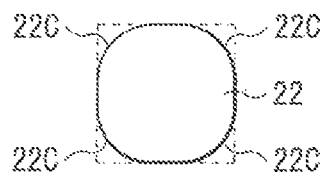
FIG. 3 is a plan view of one example of the shape of the clear layer in a case of micro-miniaturization of a pixel size in FIG. 2.

In a case in which the clear layer 22 is made of a clear resin, there is possibility that fine processing on the order of 1 μm or less may become difficult. As known, photosensitive materials may involve variation in light intensity of exposure light inside the photosensitive materials even when a mask pattern is rectangular in shape, causing corners of a rectangular pattern to be rounded. Moreover, for photosensitive materials used in formation of the clear layer 22, negative photosensitive materials similar to color filter materials are generally used. Some of them even have an inorganic pigment dispersed for higher refractive index. Performance in micro-miniaturization of a pattern of the clear layer 22 is determined by lithography performance of a resin to be used and by a concentration of a pigment dispersed in the resin. As illustrated in FIG. 2, photosensitive materials of pigment-distributed type have tendency in which corners 22C of a rectangular pattern are scraped during development, and have tendency of lower performance in fine processing as compared to normal photoresist materials for lithography. Furthermore, micro-miniaturization of a pixel as illustrated in FIG. 3 causes an increase in an occupancy ratio of scraped parts at the corners 22C to pixel area. Rectangularity of a pattern is therefore remarkably lowered, resulting in difficulties in precise formation of the clear layer 22 of a rectangular shape.

Moreover, in a case of patterning of the clear layer 22 by lithography of a clear resin, it is desirable to use a material that has photosensitivity without absorption the visible light region. However, in general, many of materials that absorb ultraviolet light to exhibit photosensitivity include a photosensitive group that has light absorption on the side of shorter wavelengths (i.e., on the side of blue light, in the vicinity of 400 nm to 450 nm both inclusive) of the visible light region. This causes difficulties in material design to attain smaller absorption in the visible light region and higher resolution. In addition, such a resin, being clear, is easily affected by reflection at lower layers; to keep its shape rectangular is difficult.

However, in the embodiment, the clear layer 22 includes the inorganic dielectric film. A shape of the clear layer 22 therefore depends on a photoresist for lithography used as an etching mask. Using a photoresist for fine processing makes it possible to maintain rectangularity of a shape and to control a pattern size, with high precision.

(B) Having the Higher Refractive Index Than the Refractive Index of the Colored Filter 12

Figure 4:
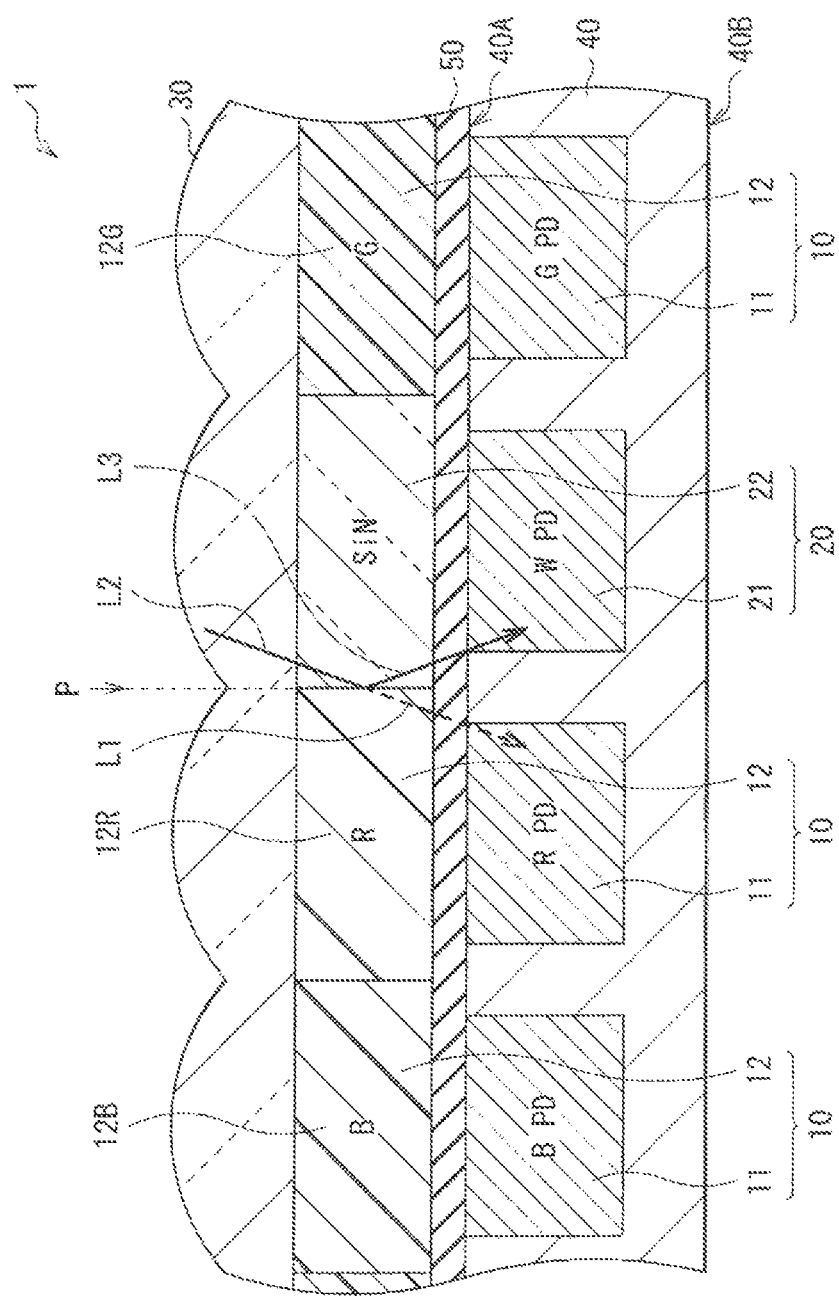
FIG. 4 is a cross-sectional view provided for description of workings of the solid-state imaging device illustrated in FIG. 1.

Since the white pixel 20 does not include the colored filter 12, an amount of light passing through the while pixel 20 is generally layer than that of the RGB colored pixels 10. Thus, as illustrated in FIG. 4, color mixture L1 of the white pixel 20 with the adjacent colored pixel 10 may easily occur. In the embodiment, a refractive index difference is provided between the clear layer 22 and the colored filter 12. This allows light L2 entering the clear layer 22 near a border between the clear layer 22 and the colored filter 12 to be reflected by an interface P between the clear layer 22 and the colored filter 12 (to produce reflected light L3), as illustrated in FIG. 4. Hence, it is possible to reduce light L1 entering the colored filter 12.

Figure 5:
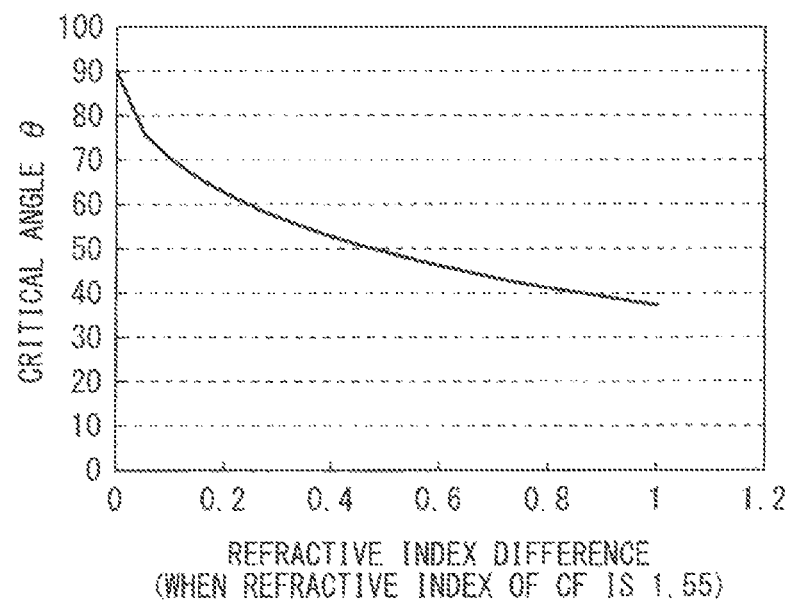
FIG. 5 is a diagram of a relation of a refractive index difference between the clear layer and a colored filter to a critical angle.
Figure 6:
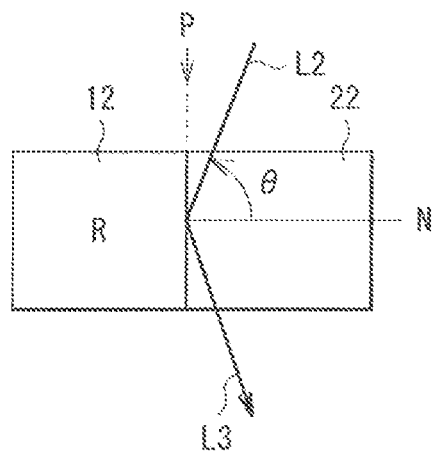
FIG. 6 is a cross-sectional view provided for description of the critical angle.

FIG. 5 illustrates a relation of the refractive index difference between the clear layer 22 and the colored filter 12 to a critical angle θ when the refractive index of the colored filter 12 is 1.55. The critical angle θ is an angle formed by a normal line N of the interface P and the entering light L2, as illustrated in FIG. 6, and is determined by the refractive index difference between the clear layer 22 and the colored filter 12. As understood from FIG. 5, the larger the refractive index difference between the clear layer 22 and the colored filter 12 is, the more reflected component L3 is reflected by the interface P, leading to higher effect of reduction in color mixture.

(C) Being Made of the Different Material from the Material of the Interlayer Insulating Film 50

When the clear layer 22 is made of the same material as the material of the interlayer insulating film 50, it is difficult to deposit and process the clear layer 22 made of an inorganic material after formation of the colored filter 12 made of an organic material. The clear layer 22 is therefore formed prior to the formation of the colored filter 12. In this case, forming the clear layer 22 with use of the same material as the material of the interlayer insulating film 50 makes it difficult to use a general end point detector in a processing apparatus for anisotropic plasma dry etching. Thus, adjustment of an amount of processing of dry etching is carried out on the basis of time. Equipment states such as a state of an etching chamber may cause variation in an etching speed, and may have influences on an amount of etching. These influences may result in possibility of variation in processing. Moreover, in a case with use of wet etching that involves isotropic etching of a film, it is desirable to control the amount of etching with higher precision, for purpose of pattern size control. In wet etching, however, the etching speed may vary due to a chemical liquid concentration or a liquid temperature, making it generally more difficult to control the amount of etching compared to anisotropic plasma dry etching. Thus, wet etching is inferior in fine processing performance, and application of wet etching to minute pixels is difficult.

In the embodiment, the clear layer 22 is made of the different material from the material of the interlayer insulating film 50 as the underlayer. This makes it possible to use a general end point detector in a case with use of dry etching for processing. Hence, it is possible to control the amount of etching with high precision.

Specifically, when the interlayer insulating film 50 is made of a silicon oxide film (a $SiO_2$ film) as mentioned above, the clear layer 22 may be preferably made of a silicon nitride film (SiN) or a silicon oxynitride film (SiON).

Figure 8:
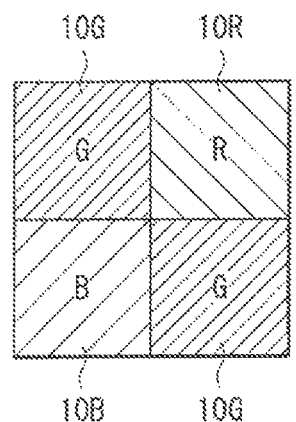
FIG. 8 is a plan view of an RGB Bayer array.

FIG. 7 illustrates one example of a two-row, two-column unit array in the solid-state imaging device 1. In this example, the colored pixels 10 may include red pixels 10R and blue pixels 10B. Two of the white pixels 20, one of the red pixels 10R, and one of the blue pixels 10B may constitute a two-row, two-column unit array U1. The white pixels 20 may be disposed on upper left and lower right, along one of diagonal lines of the unit array U1. The red pixel 10R and the blue pixel 10B may be respectively disposed on upper right and lower left, along another of the diagonal lines of the unit array U1. In other words, the unit array U1 is equivalent to an RGB Bayer array illustrated in FIG. 8 whose two green pixels 10G are replaced with the white pixels 20.

Figure 9:
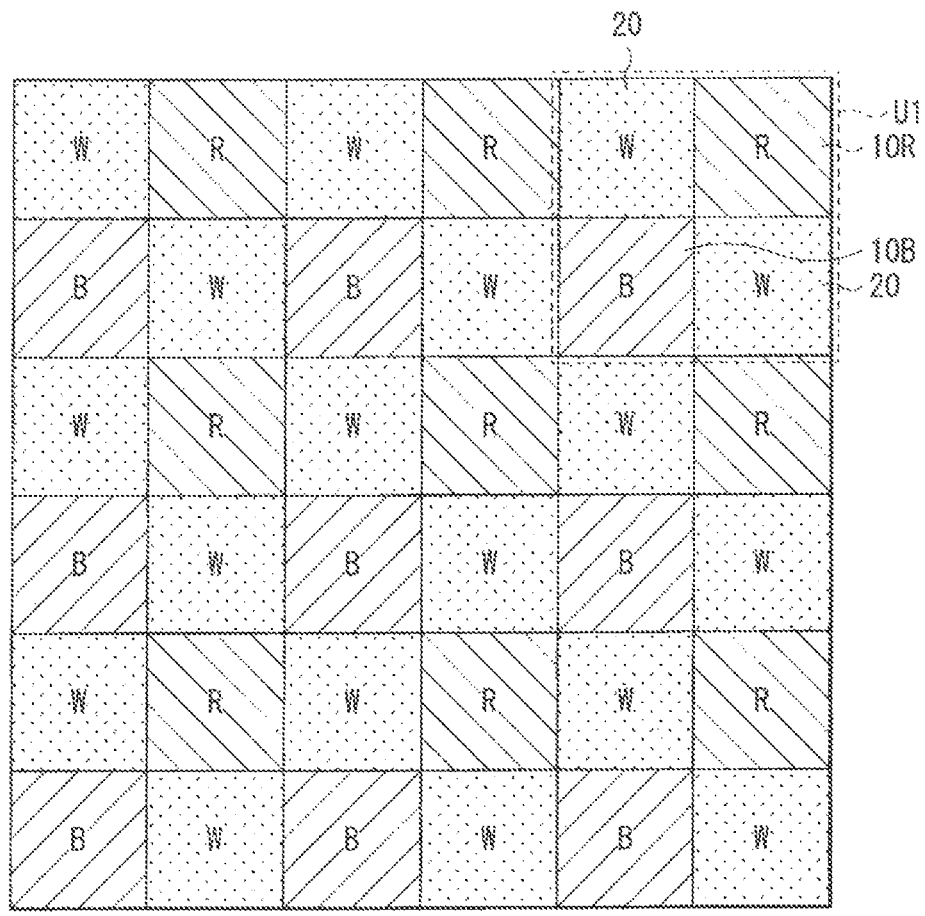

FIG. 9 illustrates a configuration in which the unit array U1 illustrated in FIG. 7 is arranged in a plurality. When the unit array U1 is arranged in a plurality, the white pixels 20 are arranged in a checkered pattern. It is therefore possible, in a later-described method of manufacture, to precisely form the clear layers 22 arranged in the checkered pattern and made of the inorganic dielectric film, and thereafter to form the colored filter 12 by embedding the colored filter 12 in recesses arranged in a checkered pattern. Hence, it is possible to form a minute pixel pattern without high lithography performance of a resin material that constitutes the colored filter 12.

FIG. 10 illustrates another example of the unit array. In this example, the colored pixels 10 may include the red pixels 10R, the blue pixels 10B, and green pixels 10G. One of the white pixels 20, one of the red pixels 10R, one of the blue pixels 10B, and one of the green pixels 10G may constitute a two-row, two-column unit array U2. The green pixel 10G and the white pixel 20 may be respectively disposed on upper left and lower right, along one of diagonal lines of the unit array U1. The red pixel 10R and the blue pixel 10B may be respectively disposed on upper right and lower left, along another of the diagonal lines of the unit array U1. In other words, the unit array U2 is equivalent to the RGB Bayer array illustrated in FIG. 8 whose green pixel 10G on lower right is replaced with the white pixel 20. FIG. 11 illustrates a configuration in which the unit array U2 illustrated in FIG. 10 is arranged in a plurality.

The solid-state imaging device 1 may be manufactured, for example, as follows. Here, description is given on a case of manufacture of the solid-state imaging device 1 including the unit array U1 in which, as illustrated in FIG. 12, the two green pixels 10G in the RGB Bayer array are replaced with the white pixels 20.

FIGS. 13 to 19 illustrate a method of manufacturing the solid-state imaging device 1 in the order of procedure. First as illustrated in FIG. 13, the first photoelectric conversion element 11 and the second photoelectric conversion element 21 may be formed on the substrate 40 made of silicon (Si). Next, the transfer transistor the FD, the multi-layered wirings, and other components (none of which is illustrated) may be formed on the front surface 40B of the substrate 40, on which the support substrate (not illustrated) may be bonded. Subsequently, the substrate 40 may be reversed, and the reversed substrate 40 may be polished or etched on the side of the rear surface 40A to form the light receiving surfaces of the first photoelectric conversion element 11 and the second photoelectric conversion element 21.

Thereafter, as illustrated in FIG. 13 as well, the interlayer insulating film 50 may be formed on the rear surface 40A of the substrate 40. The interlayer insulating film 50 may be made of the above-mentioned material, for example, a silicon oxide film ($SiO_2$).

After forming the interlayer insulating film 50, as illustrated in FIG. 13 as well, a clear layer material film 22A may be formed on the interlayer insulating film 50 by, for example, a plasma CVD (Chemical Vapor Deposition) method. The clear layer material film 22A may be formed with use of the inorganic dielectric film made of the different material from the material of the interlayer insulating film 50, for example, a silicon nitride film (SiN).

Subsequently, a photoresist film (not illustrated) may be deposited on the clear layer material film 22A. The photoresist film may be patterned to a desired pattern size and pattern arrangement, as illustrated in FIG. 14, to form a photoresist pattern PR1.

Thereafter, as illustrated in FIG. 15, the clear layer material film 22A made of SiN may be processed by anisotropic plasma dry etching DE1 to form the clear layer 22. Here, the clear layer 22 is made of the different material from the material of the interlayer insulating film 50. Therefore, when etching proceeds to reach the interlayer insulating film 50 made of a $SiO_2$ film, the processing is automatically ended by an end point detector. Thus, as illustrated in FIG. 16, the clear layers 22 are arranged in the checkered pattern with recesses 22B each of which is surrounded by four of the clear layers 22.

After forming the clear layer 22, as illustrated in FIG. 17, a color photoresist of pigment-dispersed type may be deposited by, for example, spin coating to allow a part deposited in the recess 22B to have a predetermined thickness. The color photoresist may have a blue pigment dispersed, for example. The color photoresist may be patterned by a photolithography technique to form the blue filter 12B embedded in the recess 22B. The blue filter 12B may be subjected to heat treatment, for example, at 200° C. for 10 minutes to be sufficiently cured. Similarly as illustrated in FIG. 18, for example, the red filter 12R for the remaining color may be formed.

After forming the blue filter 12B and the red filter 12R, as illustrated in FIG. 19, the on-chip lens 30 may be formed on the colored filter 12 and the clear layer 22. Thus, the solid-state imaging device 1 illustrated in FIG. 1 may be completed.

In the solid-state imaging device 1, light enters the colored pixels 10 and the white pixels 20 through the on-chip lens 30. Then, the light passes through the colored filter 12 and the first photoelectric conversion element 11 of the colored pixels 10, or passes through the clear layer 22 and the second photoelectric conversion element 21 of the white pixels 20. During the process of passing therethrough, the light is photoelectrically converted.

For example, in the solid-state imaging device 1 including the unit array U1 illustrated in FIG. 7, the signal corresponding to the wavelength range of blue may be obtained from the first photoelectric conversion element 11 below the blue filter 12B. The signal corresponding to the wavelength range of red may be obtained from the first photoelectric conversion element 11 below the reel filler 12R. A signal corresponding to an entire wavelength range including red, green, and blue may be obtained from the second photoelectric conversion element 21 below the clear layer 22.

Here, the refractive index of the clear layer 22 is higher than the refractive index of the colored filter 12. Accordingly as illustrated in FIG. 4, the light L2 obliquely entering the clear layer 22 is reflected by the interface P between the clear layer 22 and the colored filter 12 (to produce the reflected light L3), and the reflected light is returned toward the clear layer 22. This leads to reduction in the amount of the light L1 passing through the clear layer 22 and entering the adjacent colored pixel 10. Thus, color mixture of the white pixel 20 with the adjacent colored pixel 10 is restrained.

As described above, in the embodiment, the refractive index of the clear layer 22 is higher than the refractive index of the colored filter 12. Hence, it is possible to reduce the amount of the light L1 passing through the clear layer 22 and entering the adjacent colored pixel 10, and to restrain color mixture of the white pixel 20 with the adjacent colored pixel 10. Moreover, the clear layer 22 is made of the inorganic dielectric film made of the different material from the material of the interlayer insulating film 50. Hence, it is possible to control the amount of etching of the clear layer 22 with high precision, and to improve shape precision.

Second Embodiment

Description is given next on a method of manufacturing the solid-state imaging device 1 according to a second embodiment of the disclosure. The method of manufacture relates to a case of manufacture of the solid-state imaging device 1 including the unit array U2 in which, as illustrated in FIG. 20, the green pixel 10G on the lower right in the RGB Bayer array is replaced with the white pixel 20.

FIGS. 21 to 28 illustrate the method of manufacturing the solid-state imaging device 1 according to the embodiment in the order of procedure. First, as illustrated in FIG. 21, the first photoelectric conversion element 11 and the second photoelectric conversion element 21 may be formed on the substrate 40 made of silicon (Si). Next, the transfer transistor, the FD, the multi-layered wirings, and other components (none of which is illustrated) may be formed on the front surface 40B of the substrate 40, on which the support substrate (not illustrated) may be bonded. Subsequently, the substrate 40 may be reversed, and the reversed substrate 40 may be polished or etched on the side of the rear surface 40A to form the light receiving surfaces of the first photoelectric conversion element 11 and the second photoelectric conversion element 21.

Thereafter, as illustrated in FIG. 21 as well, the interlayer insulating film 50 may be formed on the rear surface 40A of the substrate 40. The interlayer insulating film 50 may be made of the above-mentioned material, for example, a silicon oxide film ($SiO_2$).

After forming the interlayer insulating film 50, as illustrated in FIG. 21 as well, the clear layer material film 22A may be formed on the interlayer insulating film 50 by, for example, a plasma CVD (Chemical Vapor Deposition) method. The clear layer material film 22A may be formed with use of the inorganic dielectric film made of the different material from the material of the interlayer insulating film 50, for example, a silicon nitride film (SiN).

Subsequently, a photoresist film (not illustrated) may be deposited on the clear layer material film 22A. The photoresist film may be patterned to a desired pattern size and pattern arrangement, as illustrated in FIG. 22, to form the photoresist pattern PR1.

Thereafter, as illustrated in FIG. 23, the clear layer material film 22A made of SiN may be processed by anisotropic plasma dry etching DE1 to form the clear layer 22. Here, the clear layer 22 is made of the different material from the material of the interlayer insulating film 50. Therefore, when etching proceeds to reach the interlayer insulating film 50 made of a $SiO_2$ film, the processing is automatically ended by an end point detector. Thus, as illustrated in FIG. 24, the clear layers 22 are arranged in a dot pattern, while other regions form the recess 22B.

After forming the clear layer 22, as illustrated in FIG. 25, a green filter material film 12GA may be deposited by, for example, spin coating with a predetermined thickness. The green filter material film 12GA may be made of a color photoresist of pigment-dispersed type having a green pigment dispersed. The green filter material film 12GA may be subjected to heat treatment, for example, at 200° C. for 10 minutes to be sufficiently cured.

Subsequently, a photoresist film (not illustrated) may be deposited on the green filter material film 12GA. The photoresist film may be patterned to a desired pattern size and pattern arrangement, as illustrated in FIG. 26, to form a photoresist pattern PR2.

Thereafter, as illustrated in FIG. 27, the green filter material film 12GA may be processed by, for example, anisotropic plasma dry etching DE2, to form the green filter 12G. At this occasion, etching conditions may be so set as to allow an inorganic material of the interlayer insulating film 50 to have a sufficient selective ratio to that of an organic material of the green filter material film 12GA. This makes it possible to remove an unnecessary part of the green filter material film 12GA. Thus, as illustrated in FIG. 28, the clear layer 22 and the green filter 12G are arranged in the checkered pattern with the recesses 22B each of which are surrounded by the clear layers 22 and the green filters 12G.

After forming the green filter 12G, as illustrated is FIG. 29, a color photoresist of pigment-dispersed type may be deposited by, for example, spin coating to allow a part deposited in the recess 22B to have a predetermined thickness. The color photoresist may have a blue pigment dispersed, for example. The color photoresist may be patterned by a photolithography technique to form the blue filter 12B embedded in the recess 22B. The blue filter 12B may be subjected to heat treatment, for example, at 200° C. for 10 minutes to be sufficiently cured. Similarly, as illustrated in FIG. 29 as well, for example, the red filter 12R for the remaining color may be formed.

After forming the blue filter 12B and the red filter 12R, as illustrated in FIG. 30, the on-chip lens 30 may be formed on the colored filter 12 and the clear layer 22. Thus, the solid-state imaging device 1 illustrated in FIG. 1 may be completed.

Third Embodiment

In the following, description is given on a method of manufacturing the solid-state imaging device 1 according to a third embodiment of the disclosure. The method of manufacture relates to a case of manufacture of the solid-state imaging device 1 including the unit array U1 in which, as illustrated in FIG. 31, the two green pixels 10G in the RGB Bayer array are replaced with the white pixels 20.

FIGS. 32 to 40 illustrate the method of manufacturing the solid-state imaging device 1 in the order of procedure. First, as illustrated in FIG. 32, the first photoelectric conversion element 11 and the second photoelectric conversion element 21 may be formed on the substrate 40 made of silicon (Si). Next, the transfer transistor, the FD, the multi-layered wirings, and other components (none of which is illustrated) may be formed on the front surface 40B of the substrate 40, on which the support substrate (not illustrated) may be bonded. Subsequently, the substrate 40 may be reversed, and the reversed substrate 40 may be polished or etched on the side of the rear surface 40A to form the light receiving surfaces of the first photoelectric conversion element 11 and the second photoelectric conversion element 21.

Thereafter, as illustrated in FIG. 32 as well, the interlayer insulating film 50 may be formed on the rear surface 40A of the substrate 40. The interlayer insulating film 50 may be made of the above-mentioned material, for example, a silicon oxide film ($SiO_2$).

After forming the interlayer insulating film 50, as illustrated in FIG. 32 as well,, the clear layer material film 22A may be formed on the interlayer insulating film 50 by, for example, a plasma CVD (Chemical Vapor Deposition) method. The clear layer material film 22A may be formed with use of the inorganic dielectric film made of the different material from the material of the interlayer insulating film 50, for example, a silicon nitride film (SiN).

Subsequently, a photoresist film (not illustrated) may be deposited on the clear layer material film 22A. The photoresist film may be patterned to a desired pattern size and pattern arrangement, as illustrated in FIG. 33, to form the photoresist pattern PR1.

Thereafter, as illustrated, in FIG. 34, the clear layer material film 22A made of SiN may be processed by anisotropic plasma dry etching DE1 to form the clear layer 22. Here, the clear layer 22 is made of the different material from the material of the interlayer insulating film 50. Therefore, when etching proceeds to reach the interlayer insulating film 50 made of a $SiO_2$ film, the processing is automatically ended by an end point detector. Thus, as illustrated in FIG. 35, the clear layers 22 are arranged in the checkered pattern with the recesses 22B each of which is surrounded by four of the clear layers 22.

After forming the clear layer 22, as illustrated in FIG. 36, a color photoresist of pigment-dispersed type may be deposited by, for example, spin coating to allow a part deposited in the recess 22B to have a predetermined thickness. The color photoresist may have a red pigment dispersed, for example. The color photoresist may be patterned by a photolithography technique to form the red filter 12R embedded in the recess 22B. The red filter 12R may be subjected to heat treatment, for example, at 200° C. for 10 minutes to be sufficiently cured. At this occasion, patterning of the red filter 12R may be so rough as to allow the red filter 12R to remain over the clear layer 22.

Subsequently, as illustrated in FIG. 37, for example, patterning of the blue filter 12B for the remaining color may be carried out in a similar manner.

After patterning and curing treatment of the colored filter 12 for the final color (here, the blue filter 12B), as illustrated in FIG. 38, the imaging pixel region (the later-described pixel unit 110) may be polished over its entire surface by CMP (Chemical Mechanical Polishing).

At this occasion, the thickness D22 of the clear layer 22 may be equal to the thickness of the colored filter 12. In this way, as illustrated in FIG. 39, it is possible to allow the clear layer 22 to serve as a stopper for CMP polishing. As completion of the polishing, the red filter 12R and the blue filter 12B may be obtained in an embedded state in the recesses 22B.

After forming the blue filter 12B and the red filter 12R, as illustrated in FIG. 40, the on-chip lens 30 may be formed on the colored filter 12 and the clear layer 22. Thus, the solid-state imaging device 1 illustrated in FIG. 1 may be completed.

Fourth Embodiment

FIG. 41 illustrates a cross-sectional configuration of a solid-state imaging device 1A according to a fourth embodiment of the disclosure. In the embodiment, a light-shielding wall 60 may be provided on light-entering side of the interlayer insulating film 50, along a boundary M between the colored pixels 10 and the white pixels 20, making it possible to restrain color mixture more effectively. Otherwise, the solid-state imaging device 1A may have similar configurations, workings, and effects to those of the solid-state imaging device 1 according to the above-described first embodiment. Accordingly, description is given with similar components denoted by similar reference numerals.

The colored pixels 10, the white pixels 20, the on-chip lens 30, the substrate 40, and the interlayer insulating film 50 may have similar configurations to those of the above-described first embodiment.

The light-shielding wall 60 is adapted to restrain color mixture more effectively, as illustrated in FIG. 41, by reflecting light L4 entering the clear layer 22 in the vicinity of a border between the clear layer 22 and the colored filter 12 (to produce reflected light L5) and reducing the light L1 entering the colored filter 12. The light-shielding wall 60 may have a shape of a lattice in plan view, as illustrated in FIG. 42, for example, along the boundary M between the colored pixels 10 and the white pixels 20.

The light-shielding wall 60 may be preferably made of a metal such as tungsten, titanium, aluminum, and copper. Among them, tungsten and titanium may be preferable. Forming the light-shielding wall 60 of tungsten or titanium makes it possible to obtain a high light-shielding property with a small thickness.

A height H60 of the light-shielding wall 60 may be preferably smaller than the thickness D22 of the clear layer 22 and the thickness D12 of the colored filter 12. When the light-shielding wall 60 has a height equal to or almost equal to those of the clear layer 22 and the colored filter 12, an aperture ratio may be lowered. The height H60 of the light-shielding wall 60 may be preferably adjusted to an appropriate value in consideration of balancing the aperture ratio and suppression of color mixture.

The solid-state imaging device 1A may be manufactured in a similar manner to those of the first to third embodiments except that the light-shielding wall 60 is formed on the interlayer insulating film 50, as illustrated in FIG. 43.

Overall Configuration of Solid-State Imaging Device

FIG. 44 is a functional block diagram of an overall configuration of the solid-state imaging device 1 described in the forgoing embodiments. The solid-state imaging device 1 may include, for example, a circuit section 130, as well as the pixel unit 110 as the imaging pixel region. The circuit section 130 may include, for example, a row scanner 131, a horizontal selector 133, a column scanner 134, and a system controller 132. The circuit section 130 may be provided in a peripheral region around the pixel unit 110. Alternatively, the circuit section 130 may be stacked above or below the pixel unit 110 (that is, in a region facing the pixel unit 110).

The pixel unit 110 may include the plurality of colored pixels 10 and the plurality of white pixels 20 (i.e., pixels PXL) that are arranged in a two-dimensional array. The pixels PXL may be wired with pixel drive lines Lread (specifically, row selector lines and reset control lines) for each pixel row, and may be wired with vertical signal lines Lsig for each pixel column. The pixel drive lines Lread are adapted to transmit drive signals to read signals from the pixels. One ends of the pixel drive lines Lread may be coupled to output terminals that correspond to their respective rows of the row scanner 131.

The row scanner 131 may include, for example, a shift register and an address decoder, and may serve as a pixel drive unit that drives the pixels PXL of the pixel unit 1a, for example, in a row unit. Signals may be outputted front the pixels PXL of a pixel row selected and scanned by the row scanner 131; and the signals thus outputted may be supplied to the horizontal selector 133 through the respective vertical signal lines Lsig. The horizontal selector 133 may include, for example, an amplifier and horizontal selector switches that are provided for each of the vertical signal lines Lsig.

The column scanner 134 may include, for example, a shift register and an address decoder, and is adapted to scan and sequentially drive the horizontal selector switches of the horizontal selector 133. Such selective scanning by the column scanner 134 allows the signals transmitted from the pixels through the respective vertical signal lines Lsig to be sequentially transmitted to a horizontal signal line 135 and to he outputted through the horizontal signal line 135.

The system controller 132 is adapted to receive, for example, a clock supplied from the outside, data on instructions of operation modes, and to output data such as internal information of the solid-state imaging device 1. Furthermore, the system controller 132 may include a timing generator that generates various timing signals, and is adapted to perform drive control of the row scanner 131, the horizontal selector 133, the column scanner 134, and other parts, based on the various timing signals generated by the timing generator.

Application Example

The solid-state imaging device 1 according to the forgoing description including the above-described example embodiments may be applied to various electronic apparatuses having imaging functions. Examples may include camera systems such as digital still cameras and video cameras, and mobile phones having imaging functions. FIG. 45 illustrates, for purpose of an example, an overall configuration of an electronic apparatus 2 (e.g., a camera). The electronic apparatus 2 may be a video camera configured to capture still images and moving pictures, and may include the solid-state imaging device 1, an optical system (an imaging lens) 310, a shutter device 311, a drive unit 313 (that includes the above-mentioned circuit section 130), a signal processing unit 312, a user interface 314, and a monitor 315. The drive unit 313 is adapted to drive the solid-state imaging device 1 and the shutter device 311.

The optical system 310 is adapted to guide image light (entering light) from an object toward the pixel unit 110 of the solid-state imaging device 1. The optical system 310 may include a plurality of optical lenses. The shutter device 311 is adapted to control a light-irradiating period and a light-shielding period of the solid-state imaging device 1. The drive unit 313 is adapted to control transfer operation of the solid-state imaging device 1 and shutter operation of the shutter device 311. The signal processing unit 312 is adapted to perform various signal processing on signals outputted from the solid-state imaging device 1. A picture signal Dout after the signal processing may be outputted to the monitor 315. Alternatively, the picture signal Dout may be stored in a storage medium such as a memory. The user interface 314 allows for designation of scenes to be photographed (e.g., designation of dynamic ranges and designation of wavelengths (such as terahertz, visible light, infrared, ultraviolet, and X ray)). Such designation (i.e., an input signal from the user interface 314) may be sent to the drive unit 313; based on the designation, desired imaging may be carried out in the solid-state imaging device 1.

Although description has been made by giving the example embodiments as mentioned above, the contents of the disclosure are not limited to the above-mentioned example embodiments, etc. and may be modified in a variety of ways. For example, in the forgoing example embodiments, description has been given on specific configurations of the solid-state imaging device 1 and 1A. However, it is not necessary to include all the components, and another component or other components may be further provided.

It is to be noted that effects described in the specification are merely exemplified and not limitative, and effects of the disclosure may be other effects or may further include other effects.

It is to be noted that the contents of the technology may have the following configurations.

(1)
A solid-state imaging device, including:
colored pixels each including a first photoelectric conversion element and a colored filter;
white pixels each including a second photoelectric conversion element and a clear layer; and
an interlayer insulating film provided between the first photoelectric conversion element and the colored filter, and between the second photoelectric conversion element and the clear layer;
wherein the colored filter is provided on light-entering side of the first photoelectric conversion element, and
the clear layer is provided on light-entering side of the second photoelectric conversion element, has a higher refractive index than a refractive index of the colored filter, and includes an inorganic dielectric film made of a different material from a material of the interlayer insulating film.

(2)
The solid-state imaging device according to (1),
wherein a thickness of the clear layer is equal to or larger than a thickness of the colored filter.

(3)
The solid-state imaging device according to (1) or (2),
wherein the interlayer insulating film is made of a silicon oxide film, and the clear layer is made of at least one of a silicon nitride film and a silicon oxynitride film.

(4)
The solid-state imaging device according to any one of (1) to (3), further including a light-shielding wall that is provided on light-entering side of the interlayer insulating film, along a boundary between the colored pixels and the white pixels.

(5)
The solid-state imaging device according to (4),
wherein a height of the light-shielding wall is smaller than a thickness of the colored filter and a thickness of the clear layer.

(6)
The solid-state imaging device according to (4) or (5),
wherein the light-shielding wall is made of at least one of tungsten, titanium, aluminum, and copper.

(7)
The solid-state imaging device according to any one of (1) to (6),
wherein the colored pixels include red pixels and blue pixels,
the white pixels are arranged in a checkered pattern, and two of the white pixels, one of the red pixels, and one of the blue pixels form a two-row, two-column unit array.

(8)
The solid-state imaging device according to any one of (1) to (6),
wherein the colored pixels include red pixels, blue pixels, and green pixels, and
one of the white pixels, one of the red pixels, one of the blue pixels, and one of the green pixels form a two-row, two-column unit array.

(9)
An electronic apparatus provided with a solid-state imaging device, the solid-state imaging device including:
colored pixels each including a first photoelectric conversion element and a colored filter;
white pixels each including a second photoelectric conversion element and a clear layer; and
an interlayer insulating film provided between the first photoelectric conversion element and the colored filter, and between the second photoelectric conversion element and the clear layer,
wherein the colored filter is provided on light-entering side of the first photoelectric conversion element, and
the clear layer is provided on light-entering side of the second photoelectric conversion element, has a higher refractive index than a refractive index of the colored filter, and includes an inorganic dielectric film made of a different material from a material of the interlayer insulating film.

This application claims the benefit of Japanese Priority Patent Application JP 2013-164062 filed on Aug. 7, 2013 the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:
1. A solid-state imaging device, comprising:
   colored pixels each including a first photoelectric conversion element and a colored filter;
   white pixels each including a second photoelectric conversion element and a clear layer; and
   an interlayer insulating film provided between the first photoelectric conversion element and the colored filter and between the second photoelectric conversion element and the clear layer,
   wherein the colored filter is provided on light-entering side of the first photoelectric conversion element, and
   the clear layer is provided on light-entering side of the second photoelectric conversion element, has a higher refractive index than a refractive index of the colored filter, and includes an inorganic dielectric film made of a different material from a material of the interlayer insulating film.
2. The solid-state imaging device according to claim 1, wherein a thickness of the clear layer is equal to or larger than a thickness of the colored filter.
3. The solid-state imaging device according to claim 1, wherein the interlayer insulating film is made of a silicon oxide film, and the clear layer is made of at least one of a silicon nitride film and a silicon oxynitride film.
4. The solid-state imaging device according to claim 1, further comprising a light-shielding wall that is provided on light-entering side of the interlayer insulating film, along a boundary between the colored pixels and the white pixels.
5. The solid-state imaging device according to claim 4, wherein a height of the light-shielding wall is smaller than a thickness of the colored filter and a thickness of the clear layer.
6. The solid-state imaging device according to claim 4, wherein the light-shielding wall is made of at least one of tungsten, titanium, aluminum, and copper.

7. The solid-state imaging device according to claim 1,
wherein the colored pixels include red pixels and blue pixels,
the white pixels are arranged in a checkered pattern, and
two of the white pixels, one of the red pixels, and one of the blue pixels form a two-row, two-column unit array.

8. The solid-state imaging device according to claim 1,
wherein the colored pixels include red pixels, blue pixels, and green pixels, and
one of the white pixels, one of the red pixels, one of the blue pixels, and one of the green pixels form a two-row, two-column unit array.

9. An electronic apparatus provided with a solid-state imaging device, the solid-state imaging device comprising:
colored pixels each including a first photoelectric conversion element and a colored filter;
white pixels each including a second photoelectric conversion element and a clear layer; and
an interlayer insulating film provided between the first photoelectric conversion element and the colored filter, and between the second photoelectric conversion element and the clear layer,
wherein the colored filter is provided on light-entering side of the first photoelectric conversion element, and
the clear layer is provided on light-entering side of the second photoelectric conversion element, has a higher refractive index than a refractive index of the colored filter, and includes an inorganic dielectric film made of a different material from a material of the interlayer insulating film.

* * * * *